(12) United States Patent
Chang et al.

(10) Patent No.: US 10,503,069 B1
(45) Date of Patent: Dec. 10, 2019

(54) METHOD OF FABRICATING PATTERNED STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 16/118,446

(22) Filed: Aug. 31, 2018

(30) Foreign Application Priority Data

Aug. 15, 2018 (CN) .......................... 2018 1 0928323

(51) Int. Cl.
| | | |
|---|---|---|
| *H01L 21/28* | (2006.01) | |
| *G03F 7/20* | (2006.01) | |
| *G03F 7/09* | (2006.01) | |
| *G03F 7/095* | (2006.01) | |
| *H01L 21/768* | (2006.01) | |

(52) U.S. Cl.
CPC .............. *G03F 7/094* (2013.01); *G03F 7/095* (2013.01); *G03F 7/2022* (2013.01); *H01L 21/76883* (2013.01); *H01L 21/76892* (2013.01)

(58) Field of Classification Search
None
See application file for complete search history.

(56) References Cited

U.S. PATENT DOCUMENTS

| | | | | |
|---|---|---|---|---|
| 8,389,383 | B1* | 3/2013 | Hopkins | H01L 29/02 257/797 |
| 2011/0129991 | A1* | 6/2011 | Armstrong | H01L 21/0273 438/585 |
| 2012/0043646 | A1* | 2/2012 | Kim | H01L 21/0337 257/618 |
| 2014/0213033 | A1* | 7/2014 | Brunco | H01L 21/762 438/400 |

OTHER PUBLICATIONS

Chang, Title of Invention: Patterning Method, U.S. Appl. No. 15/641,235, filed Jul. 4, 2017.
Chang, Title of Invention: Method of Forming Semiconductor Device, U.S. Appl. No. 15/660,967, filed Jul. 27, 2017.
Chang, Title of Invention: Patterning Method, U.S. Appl. No. 16/003,058, filed Jun. 7, 2018.

* cited by examiner

*Primary Examiner* — Khaja Ahmad
(74) *Attorney, Agent, or Firm* — Winston Hsu

(57) ABSTRACT

A method of fabricating a patterned structure includes the following steps. A first pattern transfer layer and a second pattern transfer layer are formed on a material layer. A part of the second pattern transfer layer is patterned to be a first pattern. A first spacer is formed on sidewalls of the first pattern. The first pattern transfer layer is patterned to be a second pattern and a third pattern. A cover layer is formed covering the first pattern, the first spacer, the second pattern, and the third pattern. A part of the cover layer is removed for exposing the first pattern and the first spacer. The first spacer is removed, and a patterning process is performed to the first pattern transfer layer with the first pattern and the cover layer as a mask. The second pattern is patterned to be a fourth pattern by the patterning process.

18 Claims, 39 Drawing Sheets

METHOD OF FABRICATING PATTERNED STRUCTURE

BACKGROUND OF THE INVENTION

1. Field of the Invention

The present invention relates to a method of fabricating a patterned structure, and more particularly, to a method of fabricating a patterned structure by a plurality of patterning processes.

2. Description of the Prior Art

Integrated circuit (IC) is constructed by devices and interconnections, which are formed by patterned feature in the substrate or different layers. In the fabrication of IC, the photolithography process is an essential technique. The photolithography process is configured to form designed patterns such as circuit layout patterns on one or more photomasks, and then to precisely transfer such patterns to a photoresist layer on a film by exposure and development steps. Subsequently, the complicated layout patterns are precisely transferred to a semiconductor chip.

With the miniaturization development in the semiconductor industry and the progress in semiconductor fabrication technology, the widely used conventional exposure techniques are gradually approaching their limits. Therefore, at present, the industry has also developed double exposure lithography technology or multiple exposure lithography technology to make more miniaturized semiconductor device structure. However, different photolithography processes and/or more complicated manufacturing method are required for forming patterned structures disposed in the same layer and disposed in different regions respectively because of the different shapes, the different dimensions, and/or the different densities. The manufacturing process becomes more complicated and the manufacturing cost is increased accordingly.

SUMMARY OF THE INVENTION

A method of fabricating a patterned structure is provided in the present invention. A spacer is used to realize a self-aligned patterning effect, and patterning processes on different regions are integrated for reducing total amounts of required photomasks and improving the process window.

According to an embodiment of the present invention, a method of fabricating a patterned structure is provided. The method includes the following steps. First, a first pattern transfer layer is formed on a material layer. A second pattern transfer layer is formed on the first pattern transfer layer. A first patterning process is performed to the second pattern transfer layer. A part of the second pattern transfer layer is patterned to be a first pattern by the first patterning process. A first spacer is formed on sidewalls of the first pattern. A second patterning process is performed to the first pattern transfer layer after forming the first spacer. The first pattern transfer layer is patterned to be a second pattern and a third pattern by the second patterning process, and the second pattern is formed between the material layer and the first pattern. A cover layer is formed covering the first pattern, the first spacer, the second pattern, and the third pattern. A part of the cover layer is removed for exposing the first pattern and the first spacer. The first spacer is removed. A third patterning process is performed to the first pattern transfer layer with the first pattern and the cover layer as a mask after removing the first spacer. The second pattern is patterned to be a fourth pattern by the third patterning process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-11A, FIGS. 1B-11B, FIG. 12, FIG. 13. FIGS. 14A-16A, and FIGS. 14B-16B are schematic drawings illustrating a method of fabricating a patterned structure according to a first embodiment of the present invention, wherein FIG. 1A is a top view diagram, FIG. 1B is a cross-sectional diagram taken along a cross-sectional line A-A' and a cross-sectional line B-B' in FIG. 1A, FIG. 11A is a schematic drawing in a step subsequent to FIG. 10A, FIG. 11B is a cross-sectional diagram taken along a cross-sectional line A-A' and a cross-sectional line B-B' in FIG. 11A, FIG. 12 is a schematic drawing illustrating a first region in a step subsequent to FIG. 11B, FIG. 13 is a schematic drawing in a step subsequent to FIG. 12, FIG. 14A is a schematic drawing in a step subsequent to FIG. 13, FIG. 14B is a cross-sectional diagram taken along a cross-sectional line A-A' and a cross-sectional line B-B' in FIG. 14A, FIG. 16A is a schematic drawing in a step subsequent to FIG. 15A, and FIG. 16B is a cross-sectional diagram taken along a cross-sectional line A-A' and a cross-sectional line B-B' in FIG. 16A.

FIG. 18A, FIG. 18B, FIG. 19A, FIG. 19B and FIG. 20 are schematic drawings illustrating a method of fabricating a patterned structure according to a second embodiment of the present invention, wherein FIG. 18A is a top view diagram, FIG. 18B is a cross-sectional diagram taken along a cross-sectional line A-A' in FIG. 18A, FIG. 19A is a schematic drawing in a step subsequent to FIG. 18A, FIG. 19B is a cross-sectional diagram taken along a cross-sectional line A-A' in FIG. 19A, and FIG. 20 is a schematic drawing in a step subsequent to FIG. 19A.

FIG. 21 and FIG. 22 are schematic drawings illustrating a method of fabricating a patterned structure according to a third embodiment of the present invention, wherein FIG. 22 is a schematic drawing in a step subsequent to FIG. 21.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, during the etching process, the silicon protected by the area of the photoresist layer will remain. In another example, however, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1A:
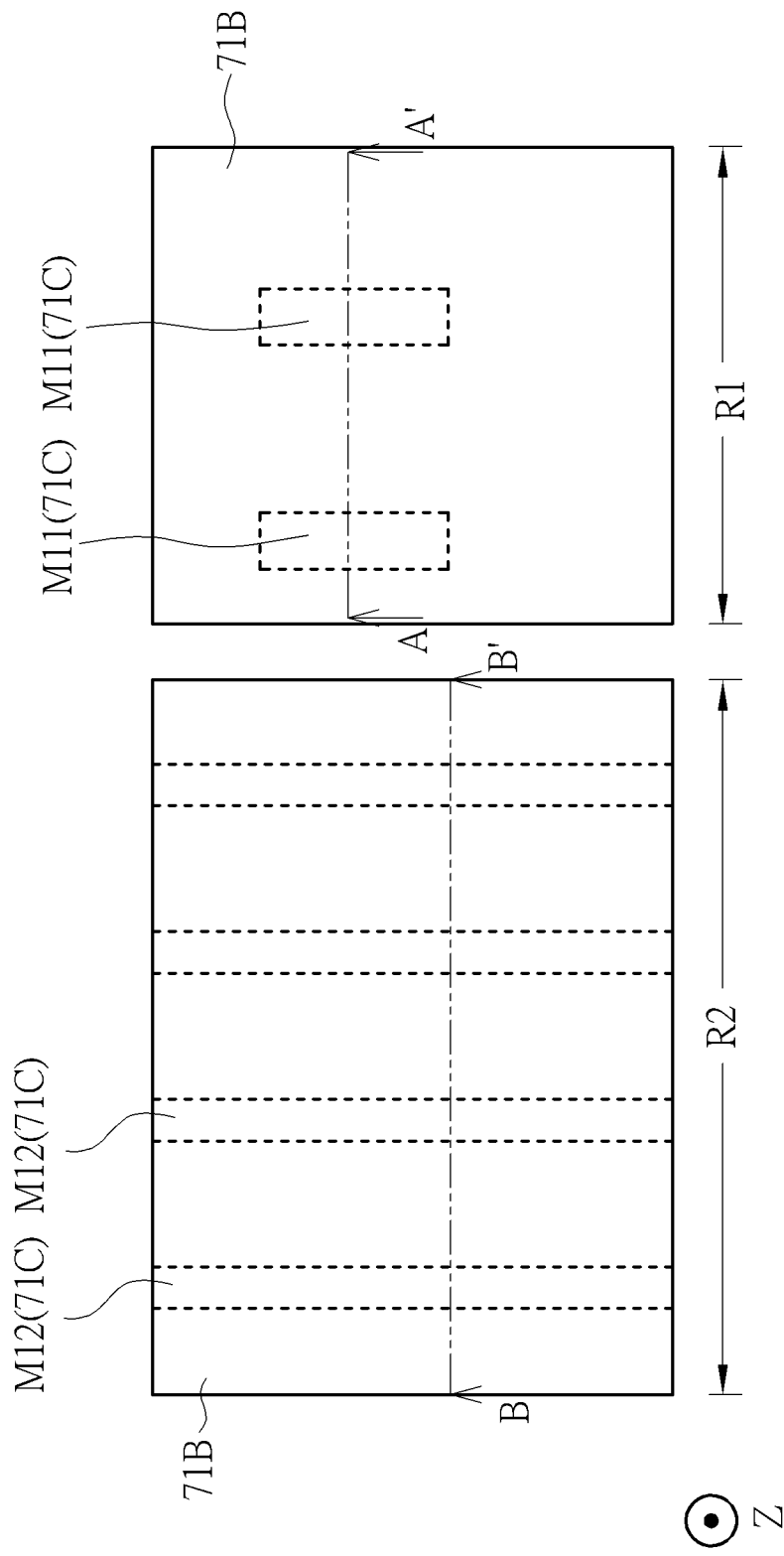
Figure 1B:
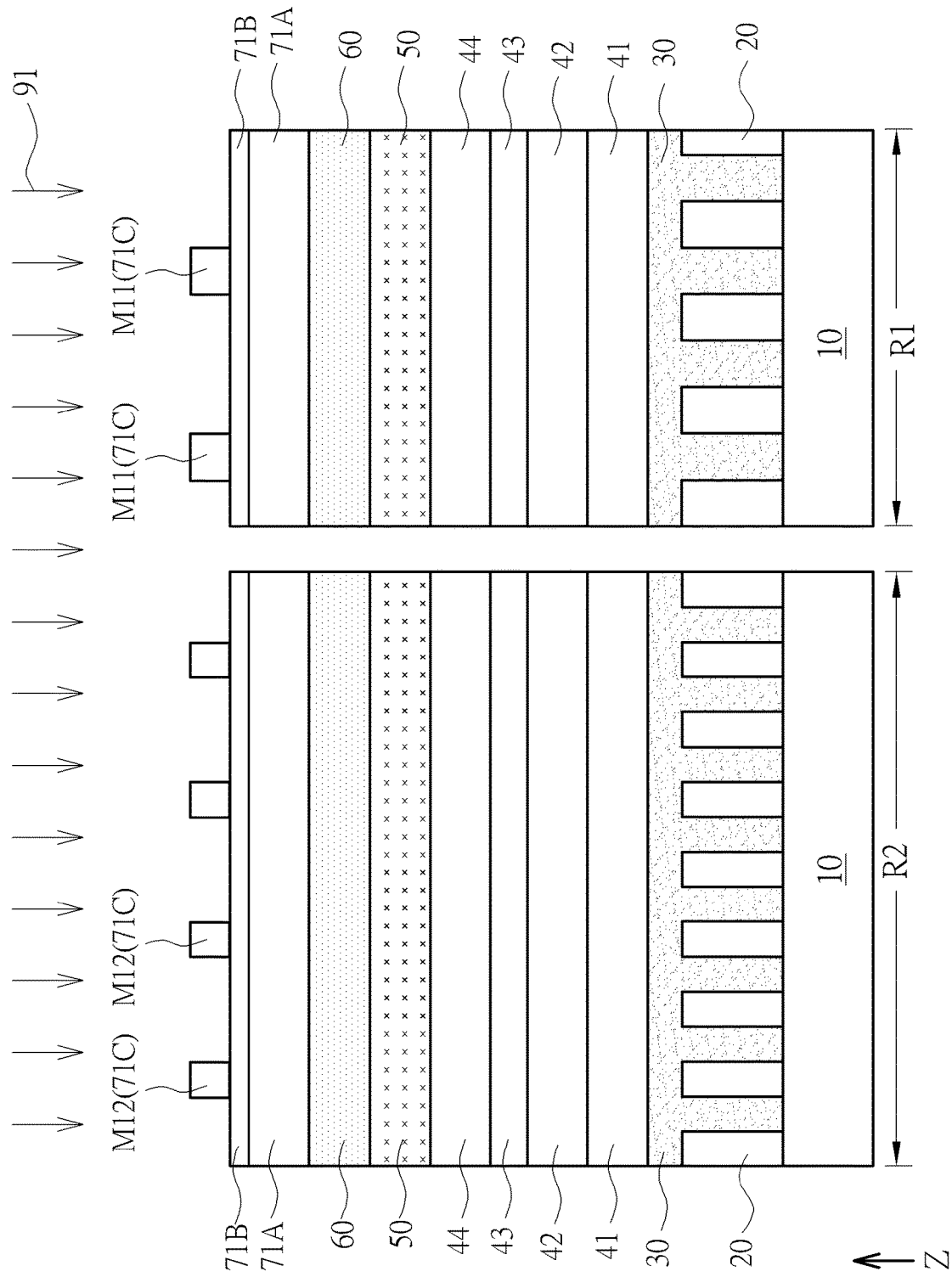

Please refer to FIGS. 1A-11A, FIGS. 1B-11B, FIG. 12, FIG. 13, FIGS. 14A-16A, and FIGS. 14B-16B. FIGS. 1A-11A, FIGS. 1B-11B, FIG. 12, FIG. 13, FIGS. 14A-16A, and FIGS. 14B-16B are schematic drawings illustrating a method of fabricating a patterned structure according to a first embodiment of the present invention. FIGS. 1A-11A and FIGS. 14A-16A are top view diagrams. FIGS. 1B-11B, FIG. 12, FIG. 13, and FIGS. 14B-16B are cross-sectional diagrams. FIGS. 1B-11B are cross-sectional diagrams taken along cross-sectional lines A-A' and cross-sectional lines B-B' in FIGS. 1A-11A respectively. FIGS. 14B-16B are cross-sectional diagrams taken along cross-sectional lines A-A' and cross-sectional lines B-B' in FIGS. 14A-16A respectively. The method of forming the patterned structure in this embodiment may include the following steps. Firstly, as shown in FIG. 1A and FIG. 1B, a first pattern transfer layer 50 is formed on a material layer 30, and a second pattern transfer layer 60 is formed on the first pattern transfer layer 50. In some embodiments, the material layer 30 may be formed on a substrate 10, an insulation layer 20 may be disposed on the substrate 10, and the material layer 30 may be at least partially disposed in the insulation layer 20, but not limited thereto. In some embodiments, the substrate 10 may include a semiconductor substrate or a non-semiconductor substrate. The semiconductor substrate mentioned above may include a silicon substrate, an epitaxial silicon substrate, a silicon germanium substrate, a silicon carbide substrate, a silicon-on-insulator (SOI) substrate, or substrates formed by other suitable semiconductor materials. The non-semiconductor substrate mentioned above may include a glass substrate, a ceramic substrate, a plastic substrate, or substrates formed by other suitable non-semiconductor materials. The insulation layer 20 may include oxide, nitride, or other suitable insulation materials. Additionally, in some embodiments, a first region R1 and a second region R2 may be defined on the substrate 10, and the material layer 30, the first pattern transfer layer 50, and the second pattern transfer layer 60 may be formed on the first region R1 and the second region R2, but not limited thereto.

The material layer 30 may include a conductive material such as aluminum, tungsten, copper, or titanium aluminide, but not limited thereto. In some embodiments, the material layer 30 may include other materials such as insulation materials according to some considerations. Additionally, other material layers may also be formed between the first pattern transfer layer 50 and the material layer 30 according to some considerations. For example, in some embodiments, a first mask layer 41, a second mask layer 42, a third mask layer 43, and a fourth mask layer 44 may be formed between the first pattern transfer layer 50 and the material layer 30 in a thickness direction Z of the substrate 10. At least some of the material compositions of the first mask layer 41, the second mask layer 42, the third mask layer 43, the fourth mask layer 44, the first pattern transfer layer 50, and the second pattern transfer layer 60 may be different from one another, but not limited thereto. For example, the first mask layer 41, the second mask layer 42, the third mask layer 43, and the fourth mask layer 44 may include a silicon nitride layer, an advanced patterning film (APF), a silicon oxynitride layer, and a polysilicon layer respectively, but not limited thereto. Additionally, in some embodiments, the material composition of the first pattern transfer layer 50 may be different from the material composition of the second pattern transfer layer 60 for providing required etching selectivity in subsequent patterning processes, and the material composition of the second pattern transfer layer 60 may be similar to the material composition of the fourth mask layer 44 for being compatible with the subsequent patterning processes, but not limited thereto. For example, the first pattern transfer layer 50 may be a silicon nitride layer, and the second pattern transfer layer 60 may be a polysilicon layer, but not limited thereto. The first mask layer 41, the second mask layer 42, the third mask layer 43, the fourth mask layer 44, the first pattern transfer layer 50, and the second pattern transfer layer 60 described above may also include other suitable dielectric materials and/or conductive materials according to other considerations.

Subsequently, as shown in FIG. 1A, FIG. 1B, FIG. 2A, and FIG. 2B, a first patterning process 91 is performed to the second pattern transfer layer 60. A part of the second pattern transfer layer 60 may be patterned to be a first pattern P1 by the first patterning process 91, and another part of the second pattern transfer layer 60 may be patterned to be a sixth pattern P6 by the first patterning process 91. In some embodiments, apart of the second pattern transfer layer 60 may be patterned to be a plurality of first patterns P1 separated from one another and formed above the first region R1 by the first patterning process 91, and another part of the second pattern transfer layer 60 may be patterned to be a plurality of sixth patterns P6 separated from one another and formed above the second region R2 by the first patterning process 91, but not limited thereto. In some embodiments, the first patterning process 91 may include a photolithography process. In the photolithography process, a first dielectric layer 71A, a first anti-reflection layer 71B, and a first patterned photoresist layer 71C may be formed in sequence on the second pattern transfer layer 60, a suitable etching process may be applied to transfer the pattern of the first patterned photoresist layer 71C to the second pattern transfer layer 60, and the first dielectric layer 71A, the first anti-reflection layer 71B, and the first patterned photoresist layer 71C may be removed after the etching process, but not limited thereto. For example, the first patterned photoresist layer 71C may include a plurality of first photoresist patterns M11 located above the first region R1 and a plurality of second photoresist patterns M12 located above the second region R2, the first patterns P1 and the sixth patterns P6 formed by patterning the second pattern transfer layer 60 may be formed corresponding to the first photoresist patterns M11 and the second photoresist patterns M12 respectively, and the first photoresist patterns M11 and the second photoresist patterns M12 may be formed by performing an exposure process with the same photomask to a photoresist material layer and performing a develop process subsequently, but not limited thereto. In some embodiments, the first dielectric layer 71A may include an organic distribution layer (ODL) or other suitable organic or inorganic dielectric materials, and the first anti-reflection layer 72A may include a silicon-containing hard mask bottom anti-reflecting coating (SHB) or other suitable anti-reflection materials. In some embodiments, the first patterns P1 and the sixth patterns P6 may be stripe patterns with elongating directions parallel to one another in a top view diagram (such as FIG. 2A), and that may be beneficial to the exposure performance in the first patterning process 91 described above, but not limited thereto.

Subsequently, as shown in FIG. 3A, FIG. 3B, FIG. 4A, and FIG. 4B, a first spacer SP1 is formed on sidewalls of the first patterns P1, and a second spacer SP2 is formed on sidewalls of the sixth patterns P6. The method of forming the first spacer SP1 and the second spacer SP2 may include but is not limited to the following steps. Firstly, a spacer material layer 80 is formed conformally on the first pattern transfer layer 50, the first patterns P1, and the sixth patterns P6, and an anisotropic etching process is then performed to the spacer material layer 80 for forming the first spacer SP1 and the second spacer SP2 on the sidewalls of the first patterns P1 and the sidewalls of the sixth patterns P6 respectively.

The spacer material layer 80 may include an insulation material such as an oxide insulation material or other suitable insulation materials or conductive materials capable of being conformally formed. Therefore, in some embodiments, the first spacer SP1 and the second spacer SP2 may be formed concurrently by the same material and the same process, but not limited thereto. In some embodiments, the first spacer SP1 and the second spacer SP2 may also be formed by different materials and/or different processes respectively according to some considerations.

As shown in FIGS. 4A-6A and FIGS. 4B-6B, a second patterned photoresist layer 72C may be formed covering the first region R1 and exposing the second region R2 after the step of forming the first spacer SP1 and the second spacer SP2, and the sixth patterns P6 on the second region R2 may be removed accordingly. After the step of removing the sixth patterns P6, a fifth patterning process 95 with the second spacer SP2 as a mask may be performed to the first pattern transfer layer 50 above the second region R2, and at least a part of the first pattern transfer layer 50 on the second region R2 may be patterned to be a seventh pattern P7 by the fifth patterning process 95. The fifth patterning process 95 may be used to transfer the pattern of the second spacer SP2 to the first pattern transfer layer 50, and the seventh pattern P7 may be formed corresponding to the pattern of the second spacer SP2. In some embodiments, the second patterned photoresist layer 72C may include a third photoresist pattern M21 covering the first pattern transfer layer 50, the first pattern P1, and the first spacer SP1 on the first region R1 during the fifth patterning process 95 for providing a protective effect. Other material layers (such as a second anti-reflection layer and a second dielectric layer, not shown) may be disposed under the third photoresist pattern M21 according to some considerations, and the second patterned photoresist layer 72C may be removed after the step of forming the seventh pattern P7, but not limited thereto.

As shown in FIG. 7A, FIG. 7B, FIG. 8A, and FIG. 8B, in some embodiments, a sixth patterning process 96 may be performed to the seventh pattern P7 on the second region, and the seventh pattern P7 may be patterned to be an eighth pattern P8 by the sixth patterning process 96. In some embodiments, the sixth patterning process 96 may include a photolithography process. In the photolithography process, a third dielectric layer 73A, a third anti-reflection layer 73B, and a third patterned photoresist layer 73C may be formed in sequence on the first region R1 and the second region R2, a suitable etching process with the third patterned photoresist layer 73C as a mask may be applied to form the eighth pattern P8, and the third dielectric layer 73A, the third anti-reflection layer 73B, and the third patterned photoresist layer 73C may be removed after the etching process, but not limited thereto. The material of the third dielectric layer 73A may be similar to the material of the first dielectric layer 71A shown in the FIG. 1B described above, and the material of the third anti-reflection layer 73B may be similar to the material of the first anti-reflection layer 71B shown in FIG. 1B described above, but not limited thereto. In some embodiments, the third patterned photoresist layer 73C may include a fourth photoresist pattern M31 located above the first region R1 and a plurality of fifth photoresist patterns M32 located above the second region R2. The fourth photoresist pattern M31 may completely cover the first region R1, each of the fifth photoresist patterns M32 may be a stripe pattern in a top view diagram (such as FIG. 7A), and the elongation direction of the fifth pattern M32 may be substantially perpendicular to the elongation direction of the seventh pattern P7, but not limited thereto. Additionally, in some embodiments, the sixth patterning process 96 may include a self-aligned double patterning (SADP) process or other suitable multiple patterning process, but not limited thereto. In some embodiments, a plurality of the eighth patterns P8 may be repeatedly arranged in the elongation direction of the first pattern P1 and in a direction perpendicular to this elongation direction for forming an array configuration, but not limited thereto.

As shown in FIG. 9A, FIG. 9B, FIG. 10A, and FIG. 10B, a second patterning process 92 is then performed to the first pattern transfer layer 50 on the first region R1. At least a part of the first pattern transfer layer 50 is patterned to be a second pattern P2 and a third pattern P3 by the second patterning process 92, and the second pattern P2 is formed between the material layer 30 and the first pattern P1 in the thickness direction Z of the substrate 10. In some embodiments, the second patterning process 92 may include a photolithography process. In the photolithography process, a fourth dielectric layer 74A, a fourth anti-reflection layer 74B, and a fourth patterned photoresist layer 74C may be formed in sequence on the first region R1 and the second region R2, a suitable etching process with the fourth patterned photoresist layer 74C as a mask may be applied for patterning the first pattern transfer layer 50 on the first region R1, and the fourth dielectric layer 74A, the fourth anti-reflection layer 74B, and the fourth patterned photoresist layer 74C may be removed after the etching process, but not limited thereto. The material of the fourth dielectric layer 74A may be similar to the material of the first dielectric layer 71A shown in the FIG. 1B described above, and the material of the fourth anti-reflection layer 74B may be similar to the material of the first anti-reflection layer 71B shown in FIG. 1B described above, but not limited thereto. In some embodiments, the fourth patterned photoresist layer 74C may include a plurality of sixth photoresist pattern M41 located above the first region R1 and a seventh photoresist patterns M42 located above the second region R2. The seventh photoresist pattern M42 may completely cover the second region R2, each of the sixth photoresist patterns M41 may be a stripe pattern in a top view diagram (such as FIG. 9A), and the elongation direction of the sixth pattern M41 may be parallel to the elongation direction of the first pattern P1, but not limited thereto. Additionally, in some embodiments, the etching rate of the first pattern P1 and the etching rate of the first spacer SP1 in the etching process of the second patterning process 92 described above may be relatively lower, and the first pattern P1 and the first space SP1 may also be regarded as the mask in this etching process accordingly. The second pattern P2 may overlap the first pattern P1 and the first spacer SP1 in the thickness direction Z of the substrate 10, and the third pattern P3 may be formed corresponding to the sixth photoresist pattern M41 in the thickness direction Z of the substrate 10, but not limited thereto. Therefore, the second pattern P2 may be formed separately from the third pattern P3 when the sixth photoresist patterns M41 do not overlap the first pattern P1 and the first spacer SP1 in the thickness direction Z of the substrate 10, but not limited thereto. In some embodiments, the second pattern P2 may be formed and connected with the third pattern P3 when the sixth photoresist pattern M41 partially overlaps the first spacer SP1 and/or the first pattern P1 in the thickness direction Z of the substrate 10.

Figure 11A:
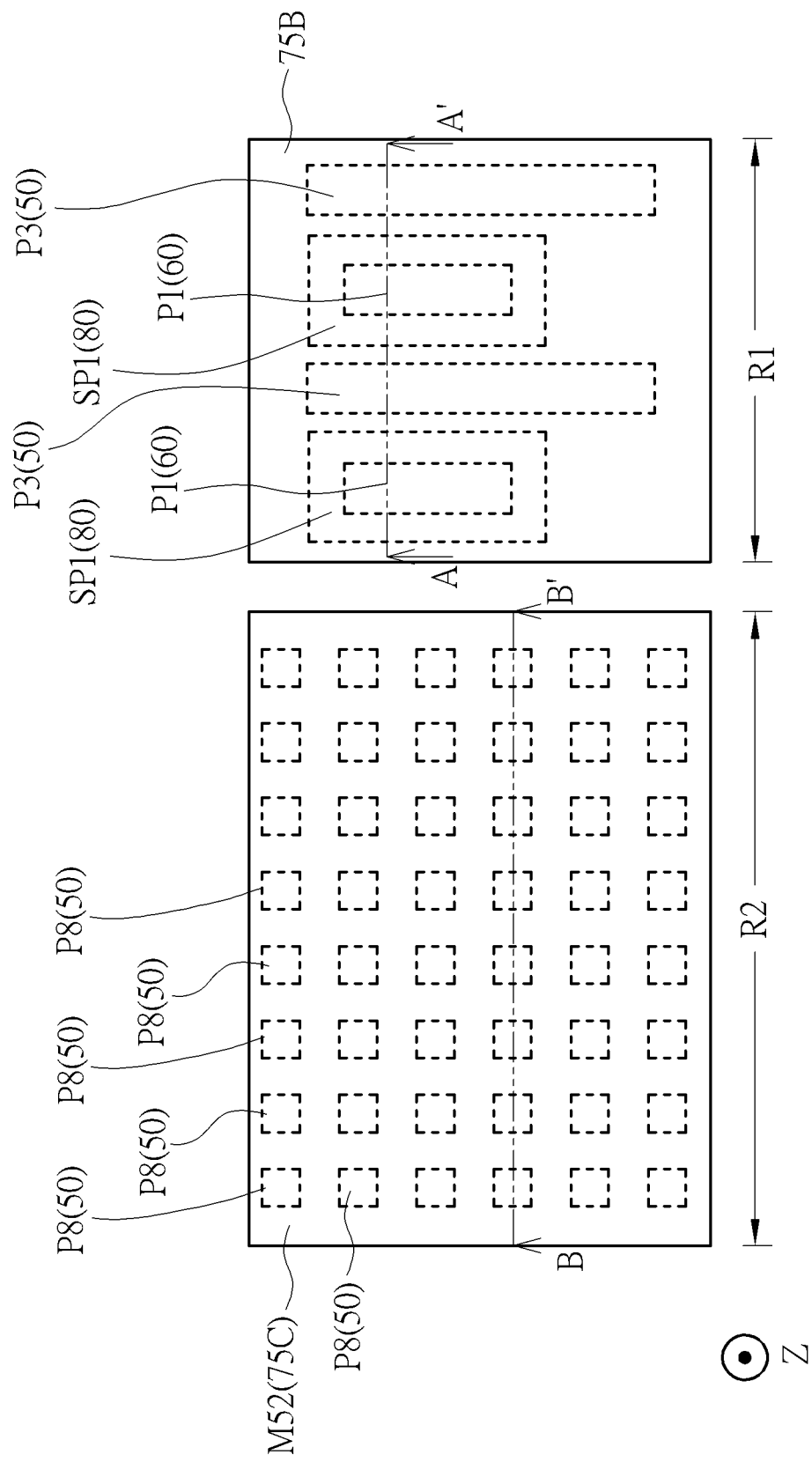
Figure 11B:
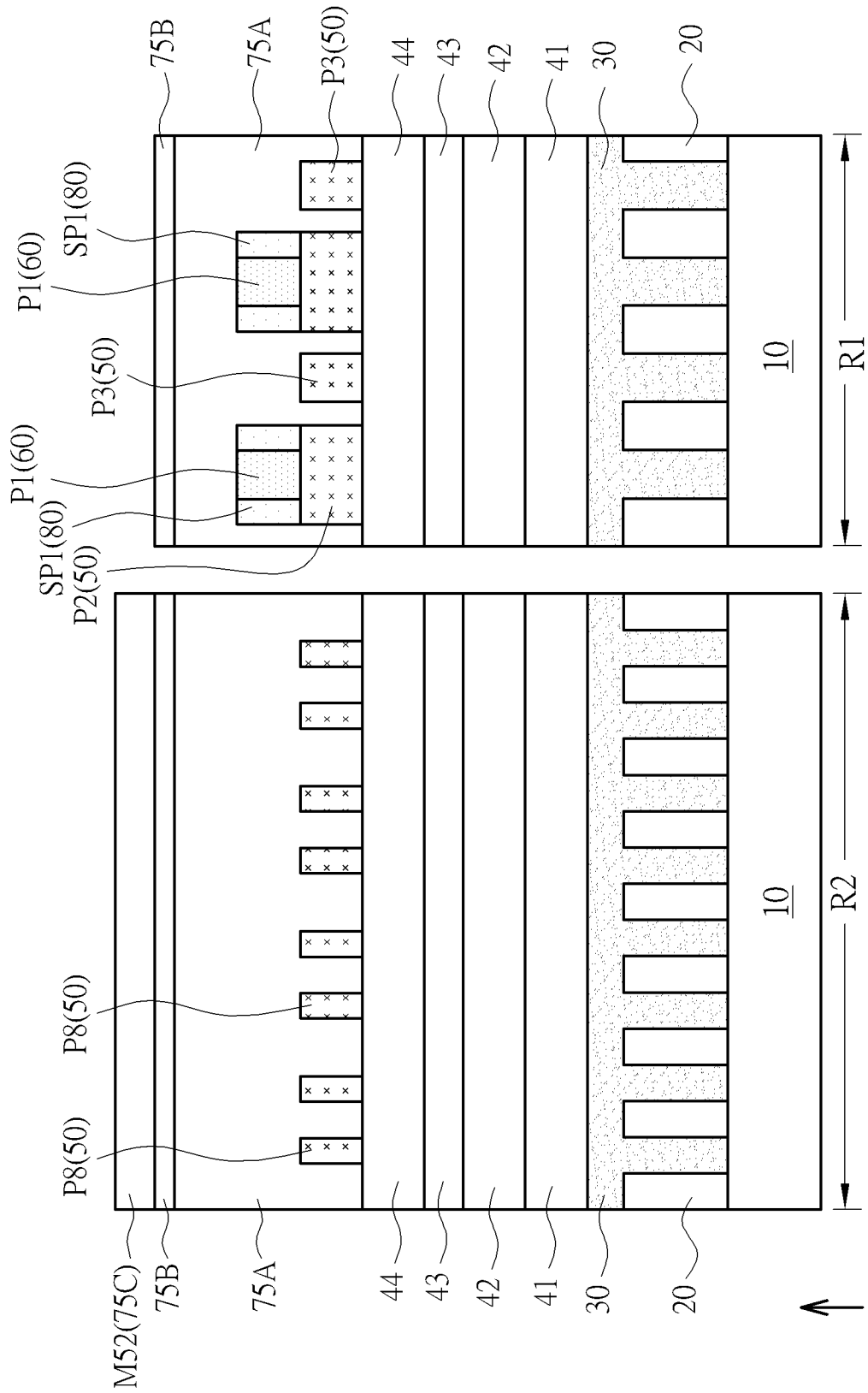
Figure 12:
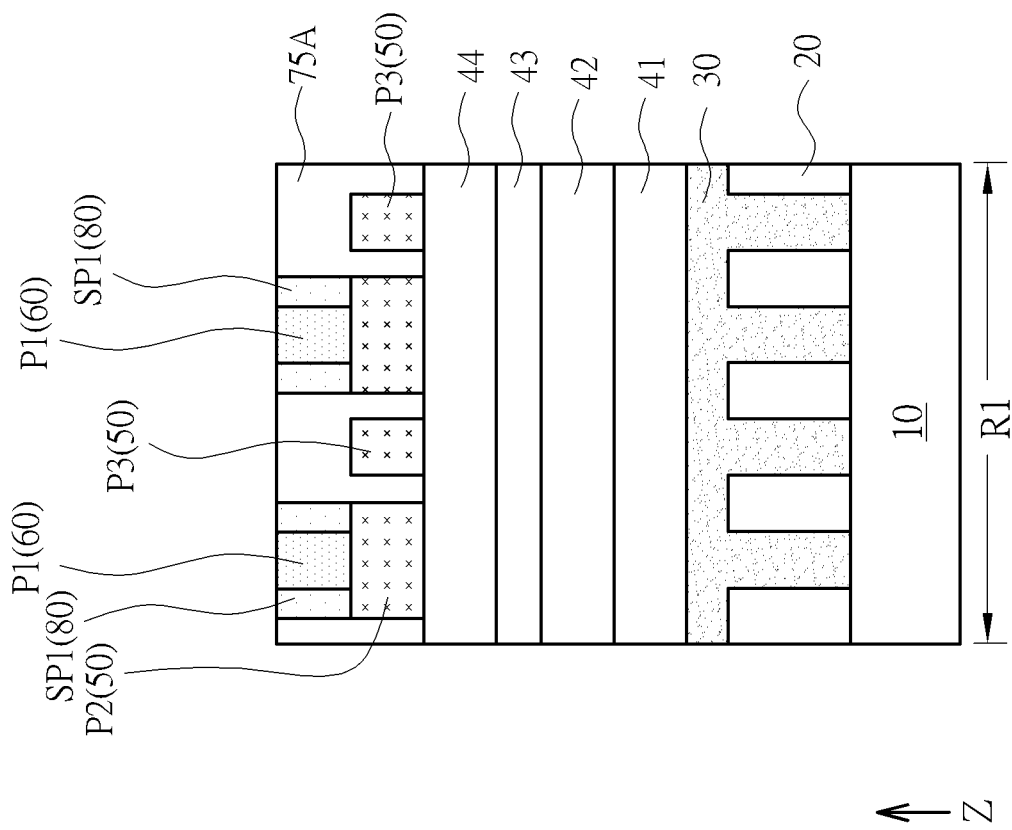

As shown in FIG. 11A and FIG. 11B, a cover layer (such as a fifth dielectric layer 75A and a fifth anti-reflection layer 75B shown in FIG. 11B) may be formed covering the first pattern P1, the first spacer SP1, the second pattern P2, and the third pattern P3. In some embodiments, the fifth dielectric layer 75A and the fifth anti-reflection layer 75B may be formed on the first region R1 and the second region R2, and a fifth patterned photoresist layer 75C may be formed on the fifth anti-reflection layer 75B above the second region R2. The material of the fifth dielectric layer 75A may be similar to the material of the first dielectric layer 71A shown in the FIG. 1B described above, and the material of the fifth anti-reflection layer 75B may be similar to the material of the first anti-reflection layer 71B shown in FIG. 1B described above, but not limited thereto. In some embodiments, the fifth patterned photoresist layer 75C may include an eighth photoresist pattern M52 covering the eighth patterns P8 on the second region R2 for providing a protective effect, but not limited thereto. Subsequently, as shown in FIG. 11B and FIG. 12, a part of the cover layer is removed (such as removing the fifth anti-reflection layer 75B on the first region R1 and a part of the fifth dielectric layer 75A on the first region R1) for exposing the first pattern P1 and the first spacer SP1. As shown in FIG. 12, FIG. 13, FIG. 14A, and FIG. 14B, the first spacer SP is then removed for exposing a part of the second pattern P2. A third patterning process 93 is then performed to the first pattern transfer layer 50 with the first pattern P1 and the cover layer (such as the fifth dielectric layer 75A) as a mask after removing the first spacer SP1. The second pattern P2 may be patterned to be a fourth pattern P4 by the third patterning process 93. In some embodiments, the third patterning process 93 may include an etching process performed to the first pattern transfer layer 50, and the etching rates of the second pattern transfer layer 60, the fifth dielectric layer 75A, and the fourth mask layer 44 in this etching process may be relatively lower preferably. The fifth dielectric layer 75A, the fifth anti-reflection layer 75B, and the fifth patterned photoresist layer 75C on the second region R2 shown in FIG. 11B described above and the fifth dielectric layer 75A on the first region R1 may be removed after the third patterning process 93, but not limited thereto.

As shown in FIGS. 14A-16A and FIGS. 14B-16B, a fourth patterning process 94 may be performed for transferring the fourth pattern P4, the third pattern P3, and the eighth patterns P8 to the material layer. For example, at least a part of the material layer 30 on the first region R1 may be patterned to be a first material layer pattern 30A by the fourth patterning process 94, and at least a part of the material layer 30 on the second region R2 may be patterned to be a second material layer pattern 30B by the fourth patterning process 94. The projection pattern of the first material layer pattern 30A in the thickness direction Z of the substrate 10 may be corresponding to and similar to the projection pattern of the fourth pattern P4 or the projection pattern of the third pattern P3 in the thickness direction Z of the substrate 10, and the projection pattern of the second material layer pattern 30B in the thickness direction Z of the substrate 10 may be corresponding to and similar to the projection pattern of the eighth pattern P8 in the thickness direction Z of the substrate 10. Additionally, in some embodiments, the fourth patterning process 94 may include etching steps for transferring the fourth pattern P4, the third pattern P3, and the eighth pattern P8 to the first mask layer 41 and the second mask layer 42 by an etching step first and then forming the first material layer pattern 30A and the second material layer pattern 30B by another etching step with the patterned first mask layer 41 and the patterned second mask layer 42 as a mask, but not limited thereto. In some embodiments, the fourth pattern P4, the third pattern P3, and the eighth pattern P8 may also be transferred to the material layer 30 by other approaches according to other considerations.

Figure 2A:
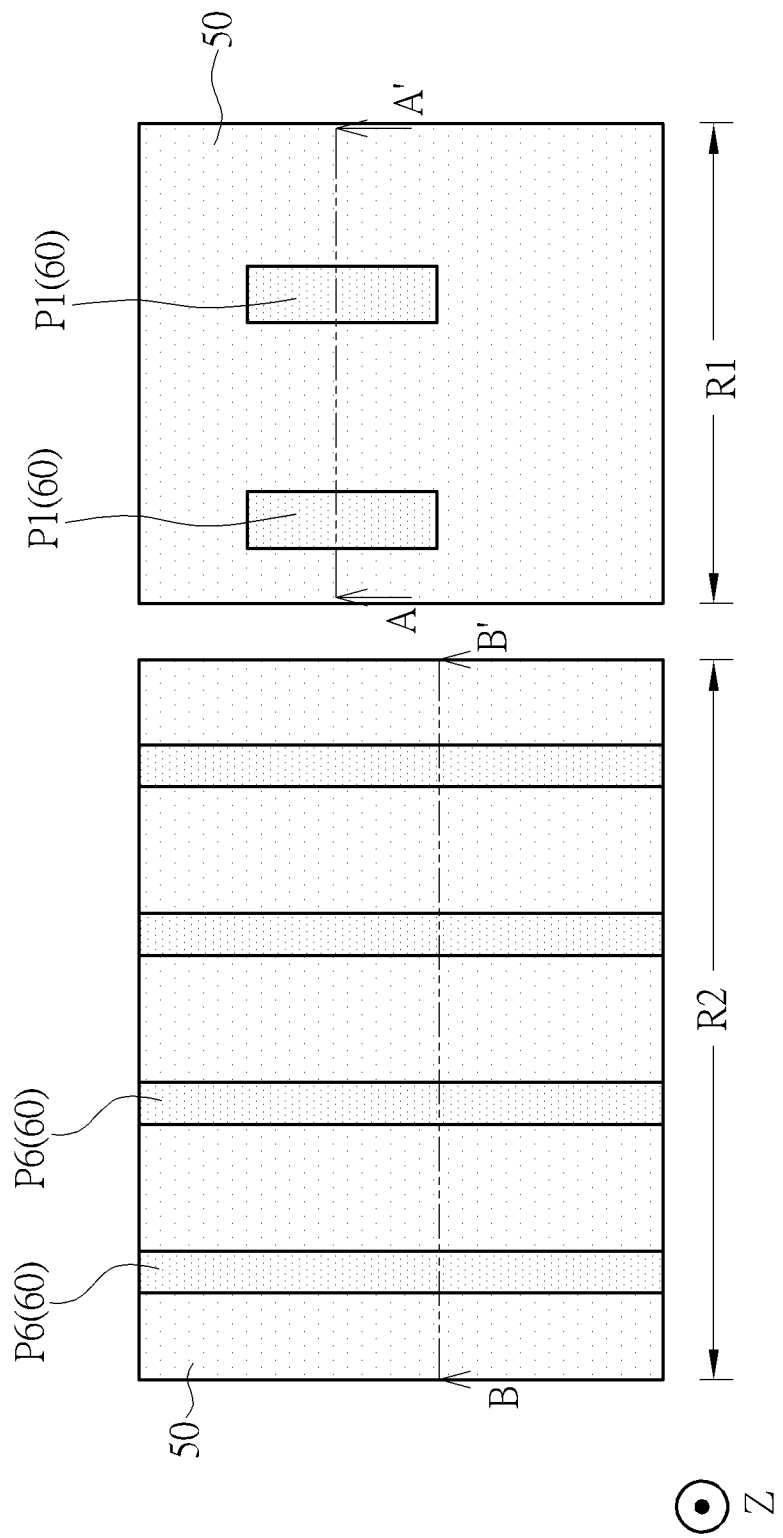
FIG. 2A is a schematic drawing in a step subsequent to FIG. 1A.
Figure 2B:
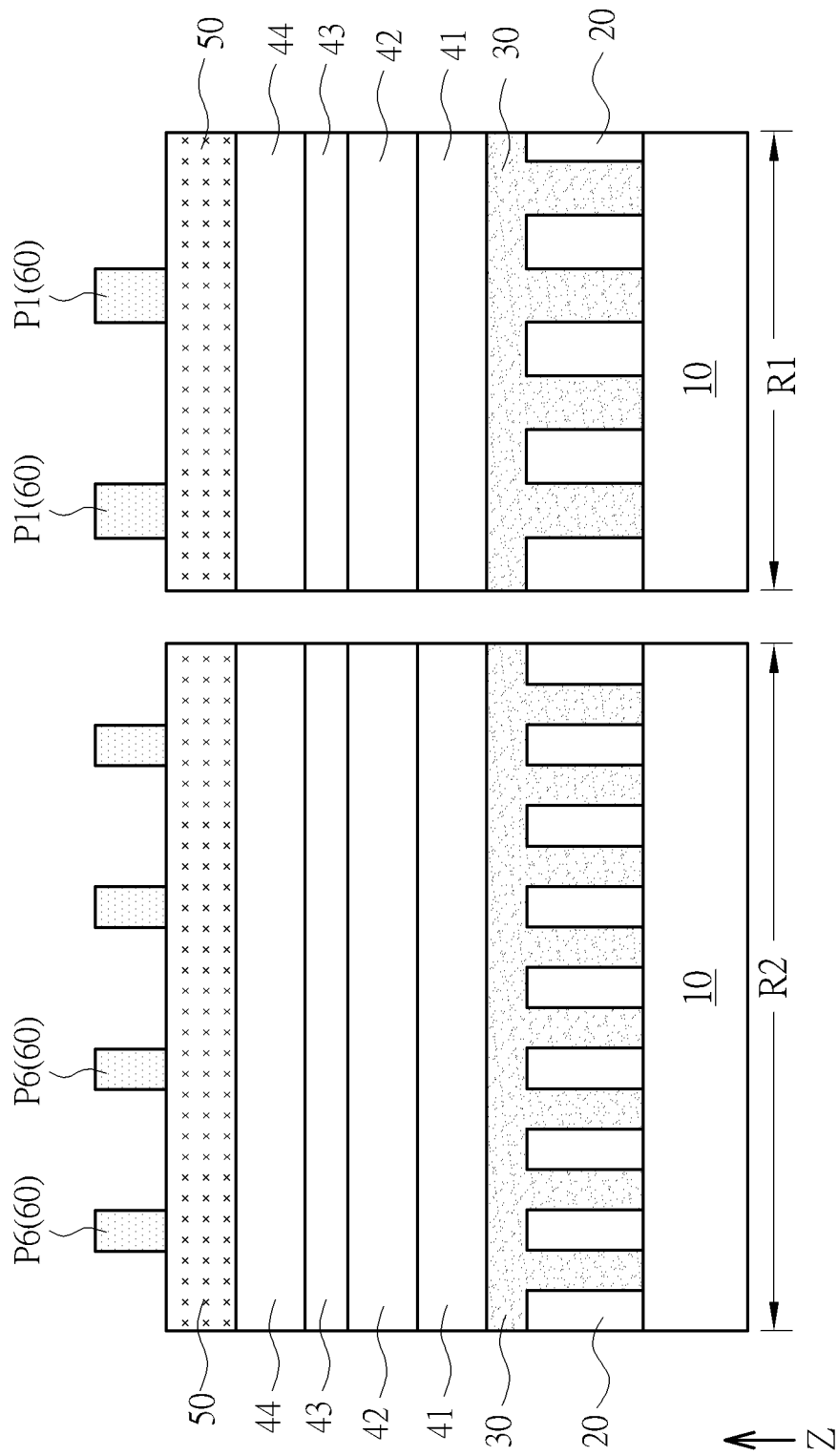
FIG. 2B is a cross-sectional diagram taken along a cross-sectional line A-A' and a cross-sectional line B-B' in FIG. 2A.
Figure 3A:
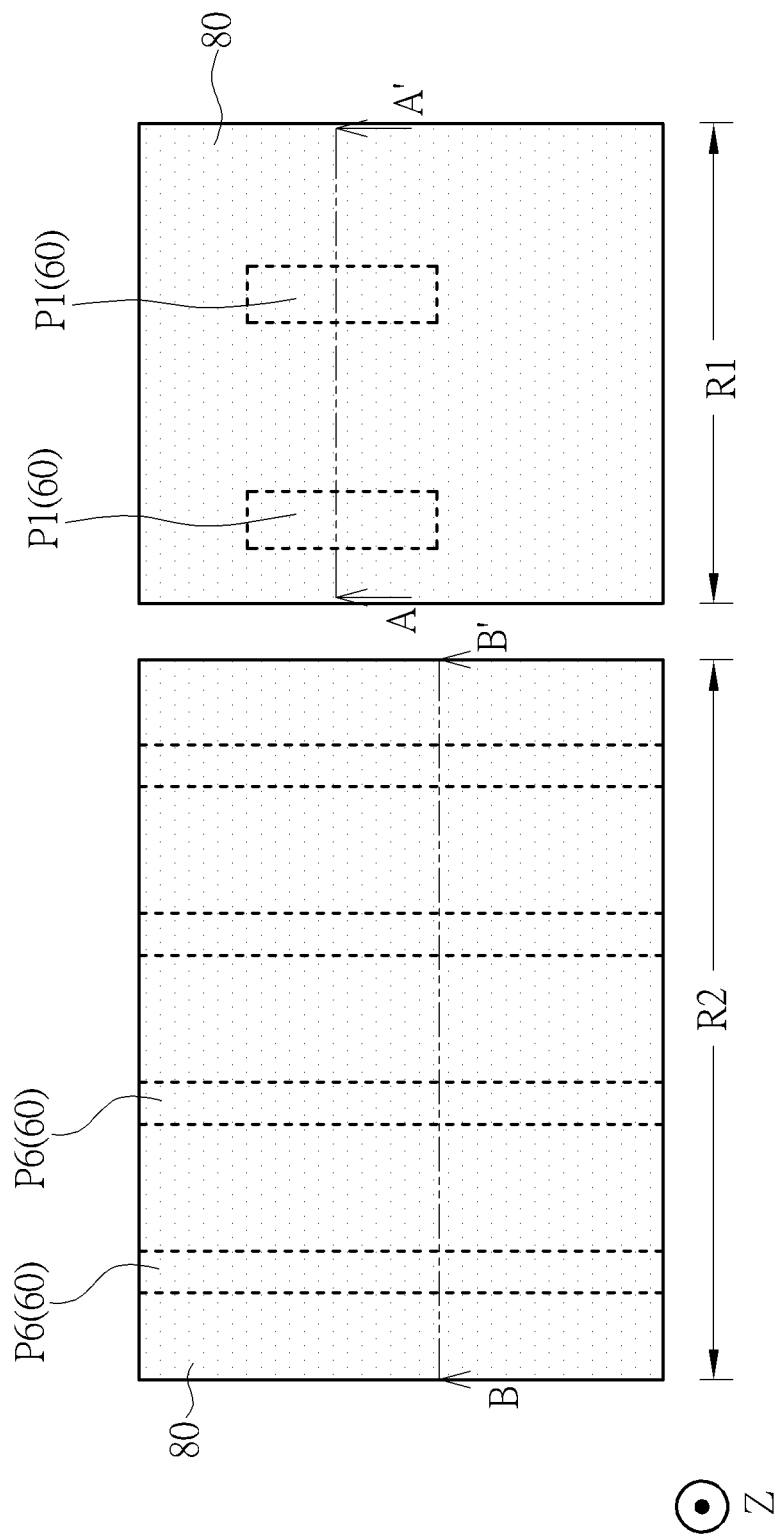
FIG. 3A is a schematic drawing in a step subsequent to FIG. 2A.
Figure 3B:
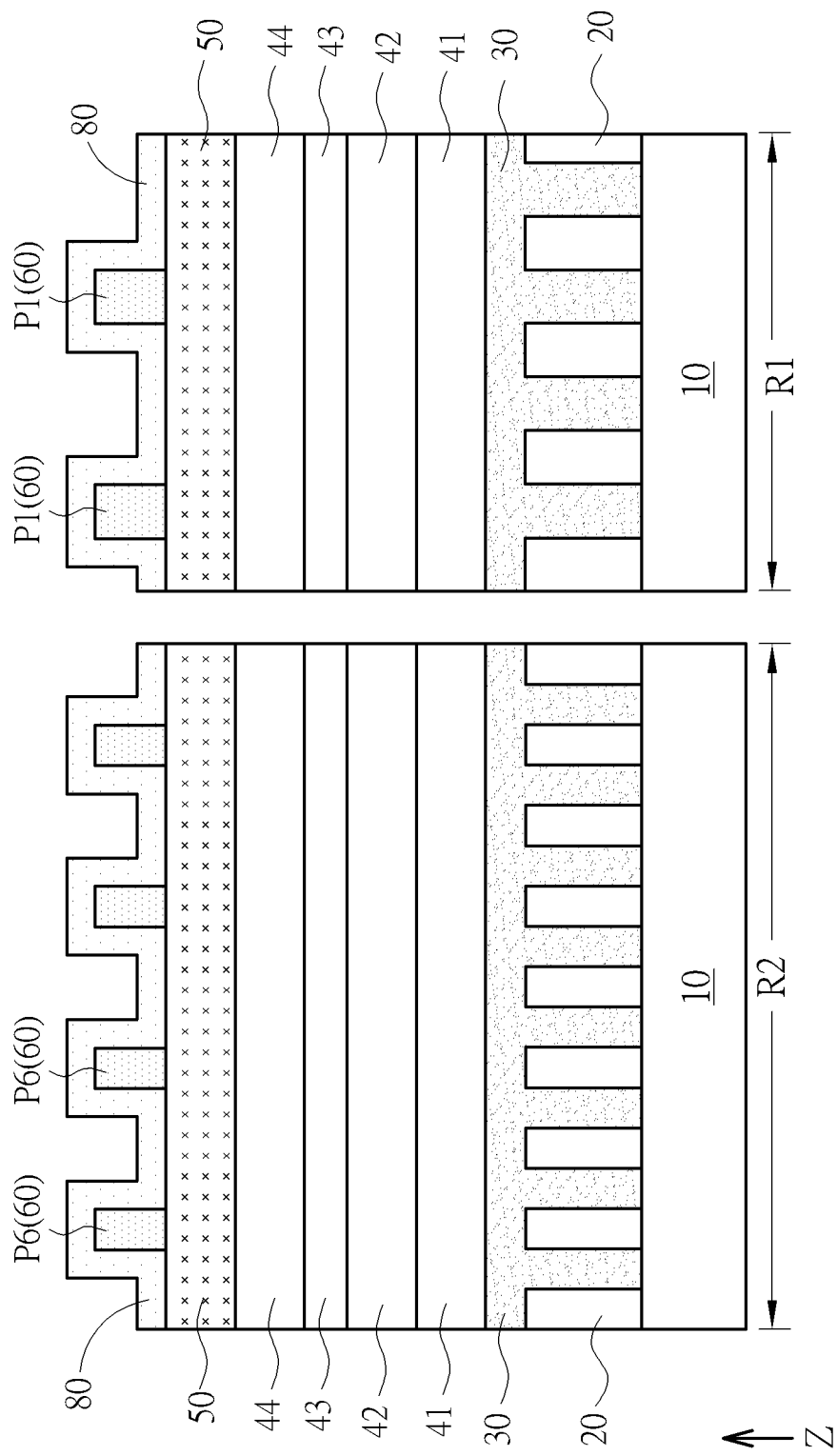
FIG. 3B is a cross-sectional diagram taken along a cross-sectional line A-A' and a cross-sectional line B-B' in FIG. 3A.
Figure 4A:
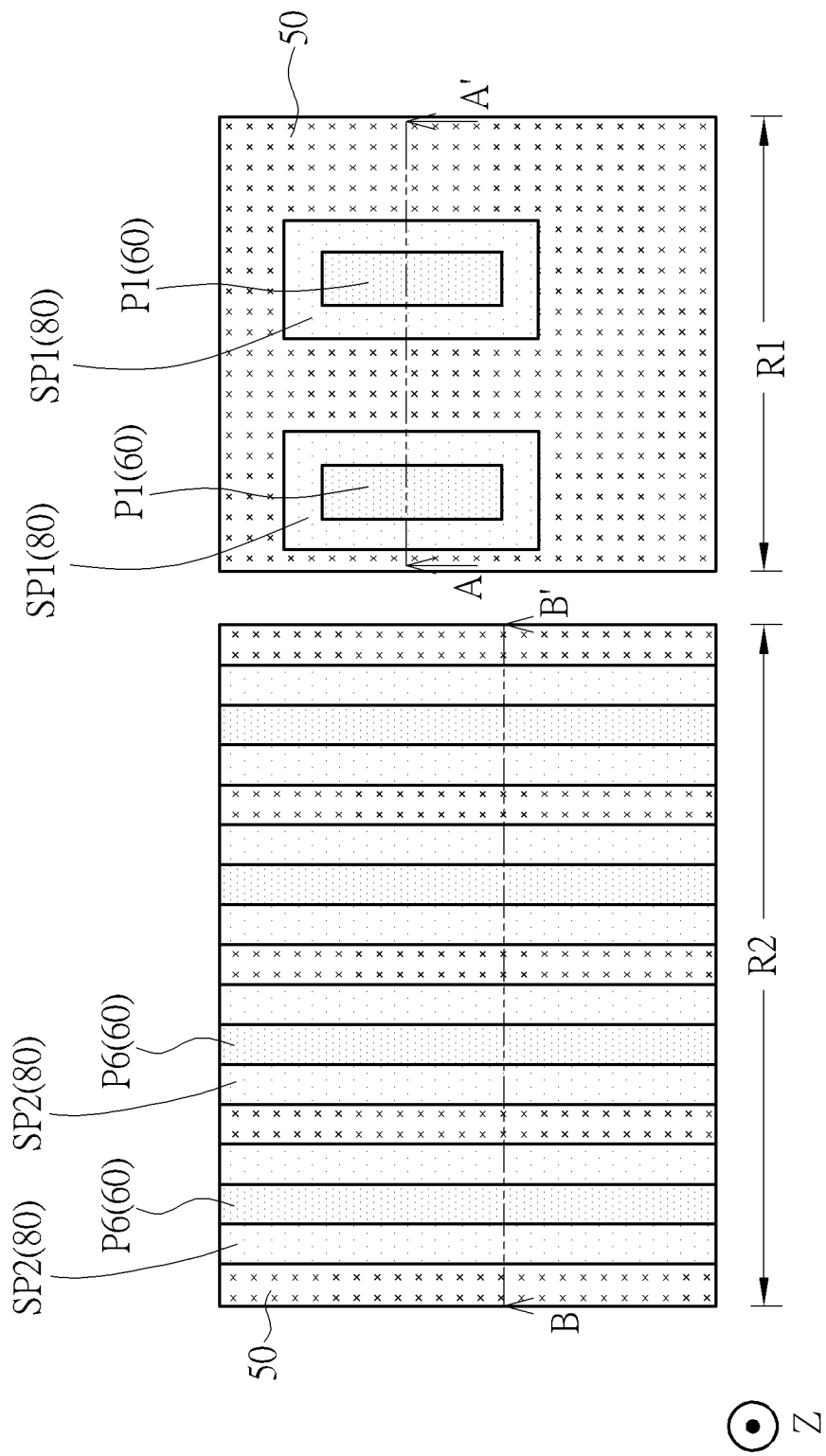
FIG. 4A is a schematic drawing in a step subsequent to FIG. 3A.
Figure 4B:
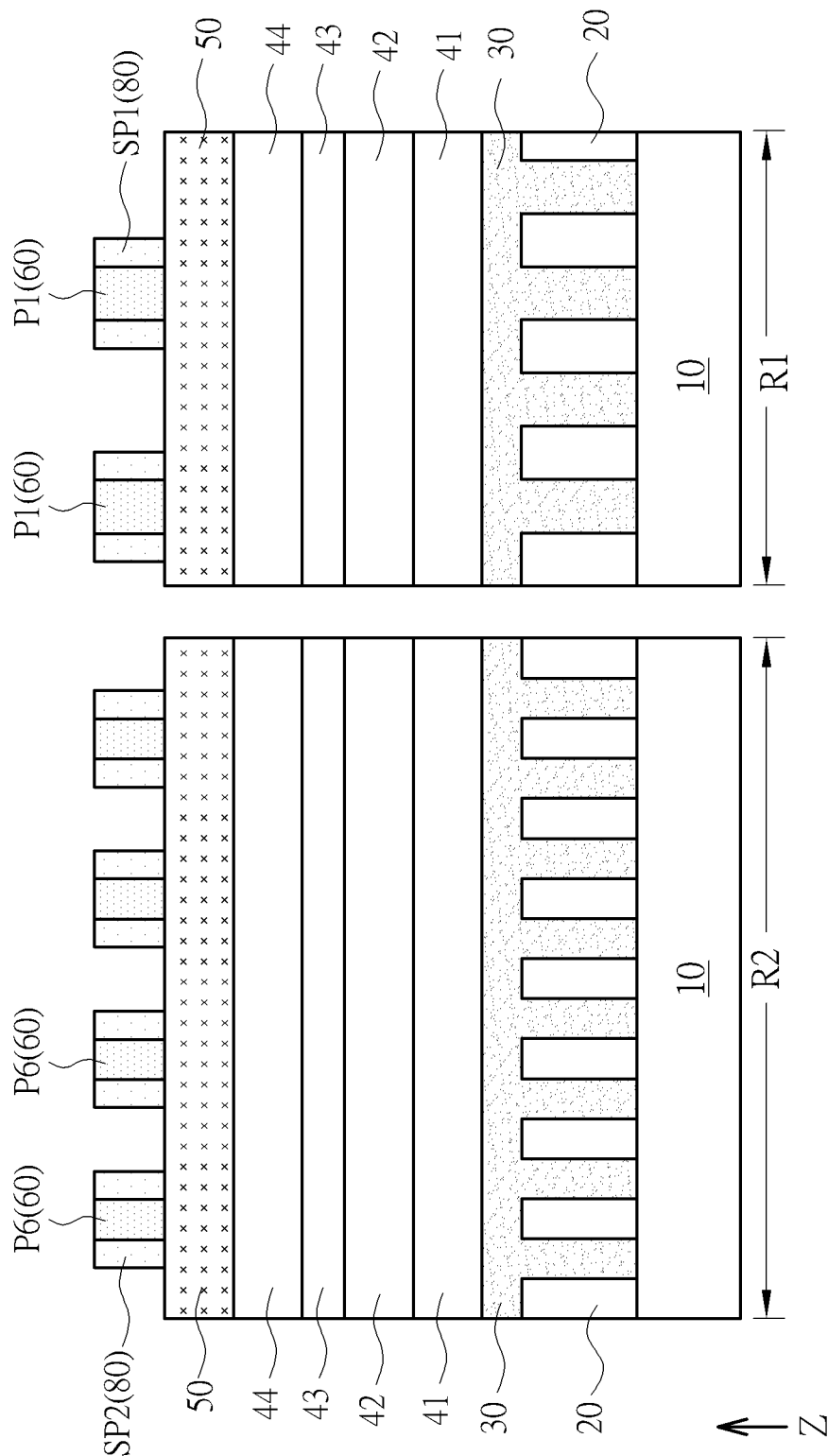
FIG. 4B is a cross-sectional diagram taken along a cross-sectional line A-A' and a cross-sectional line B-B' in FIG. 4A.
Figure 5A:
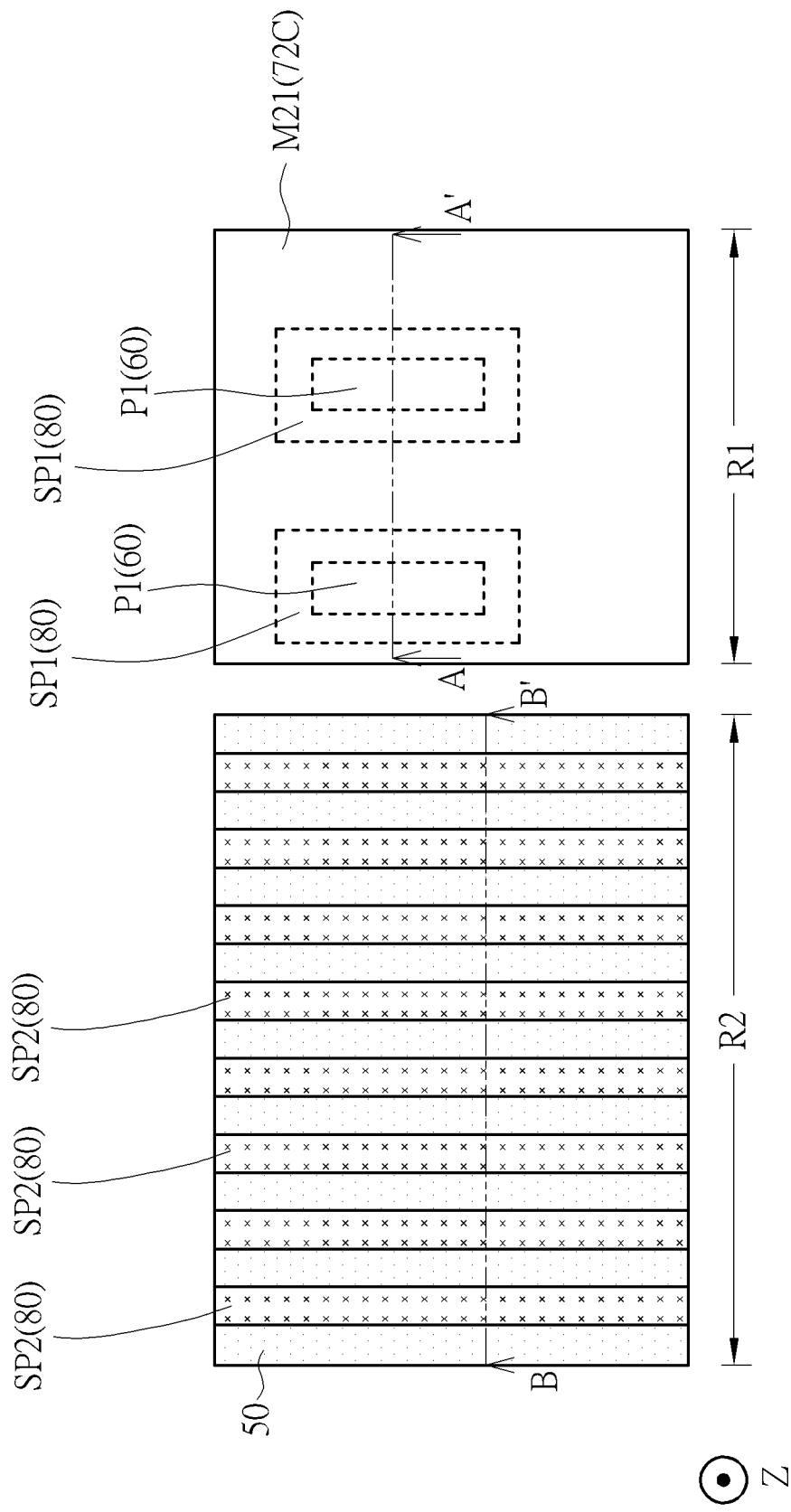
FIG. 5A is a schematic drawing in a step subsequent to FIG. 4A.
Figure 5B:
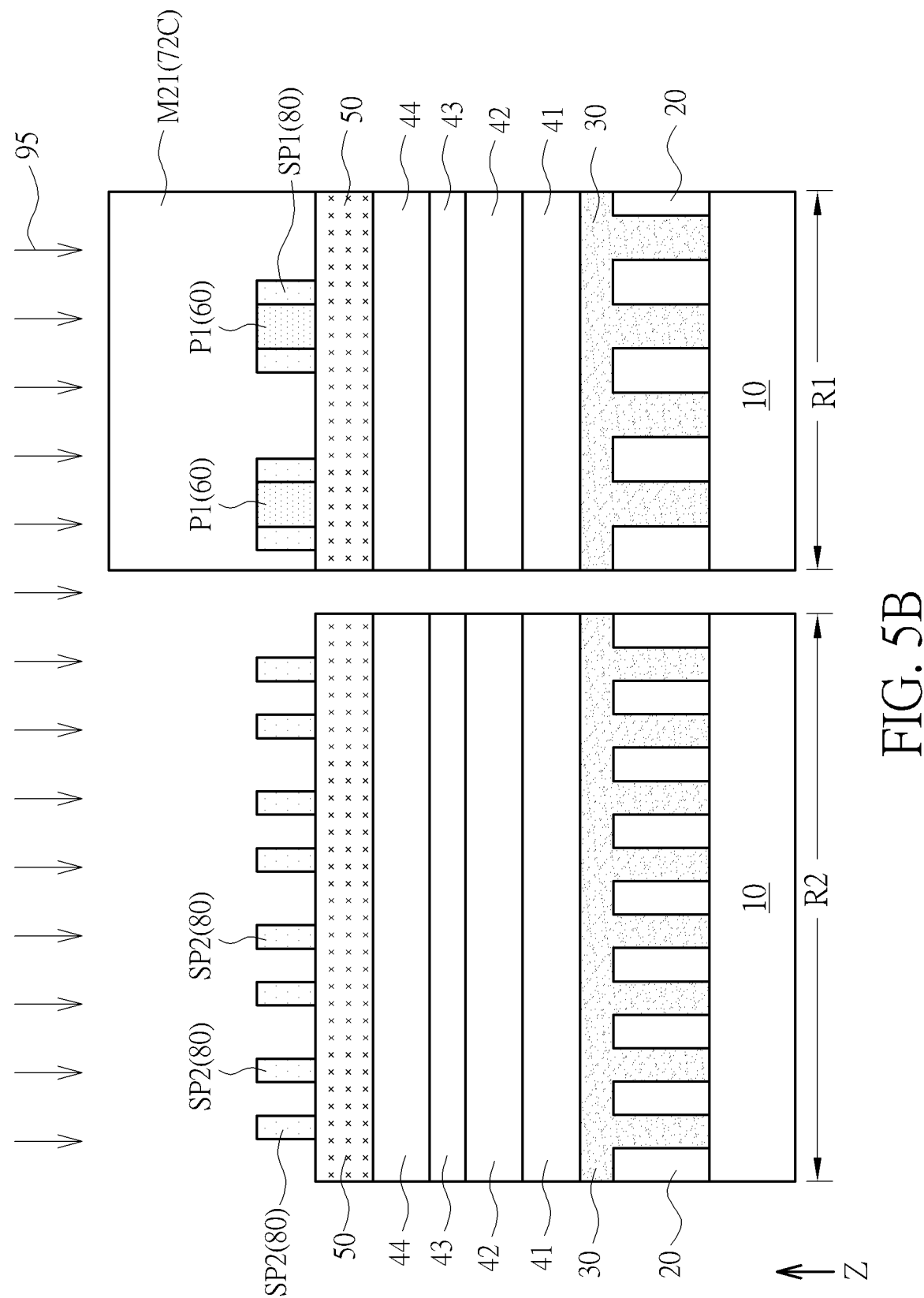
FIG. 5B is a cross-sectional diagram taken along a cross-sectional line A-A' and a cross-sectional line B-B' in FIG. 5A.
Figure 6A:
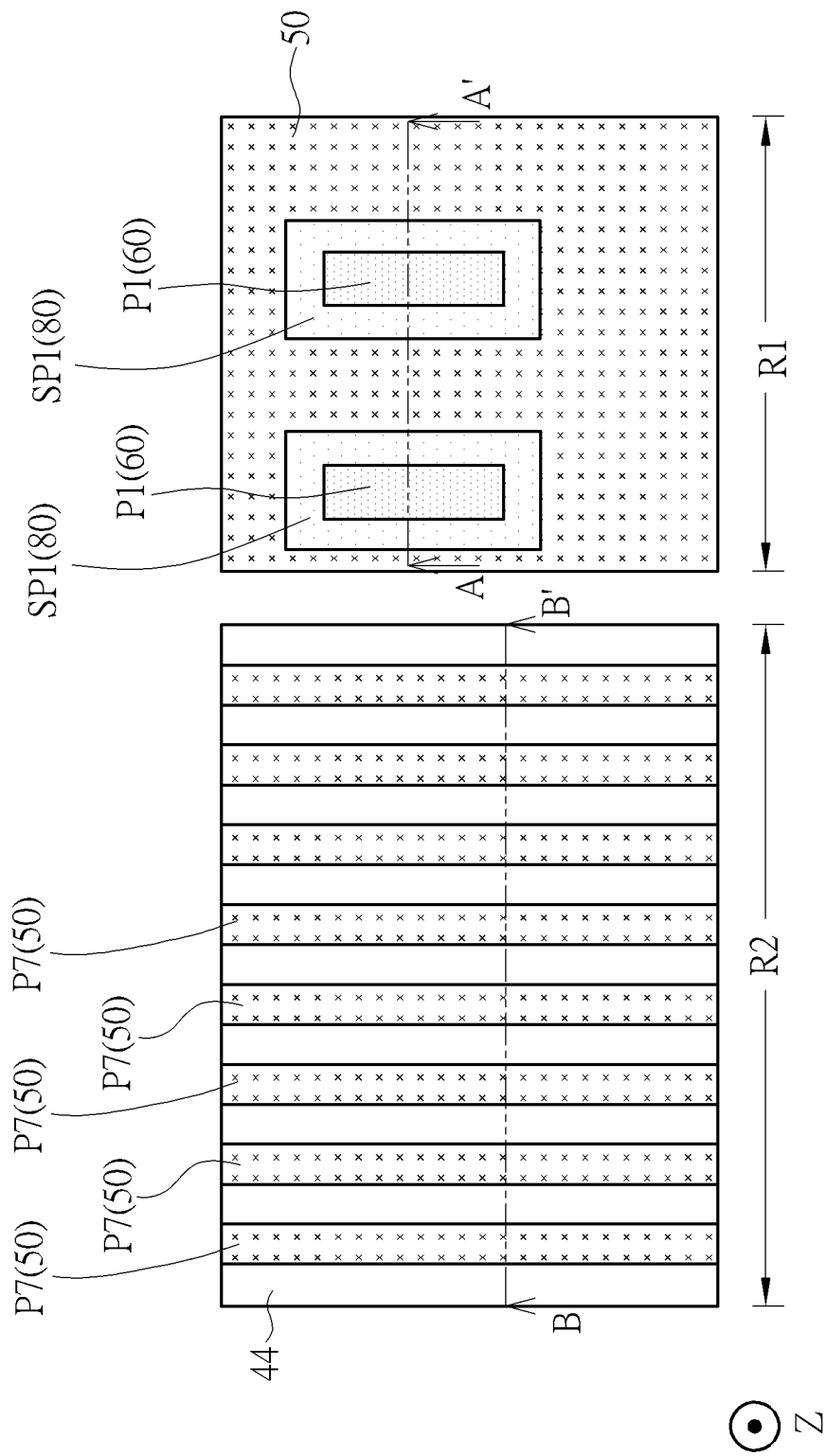
FIG. 6A is a schematic drawing in a step subsequent to FIG. 5A.
Figure 6B:
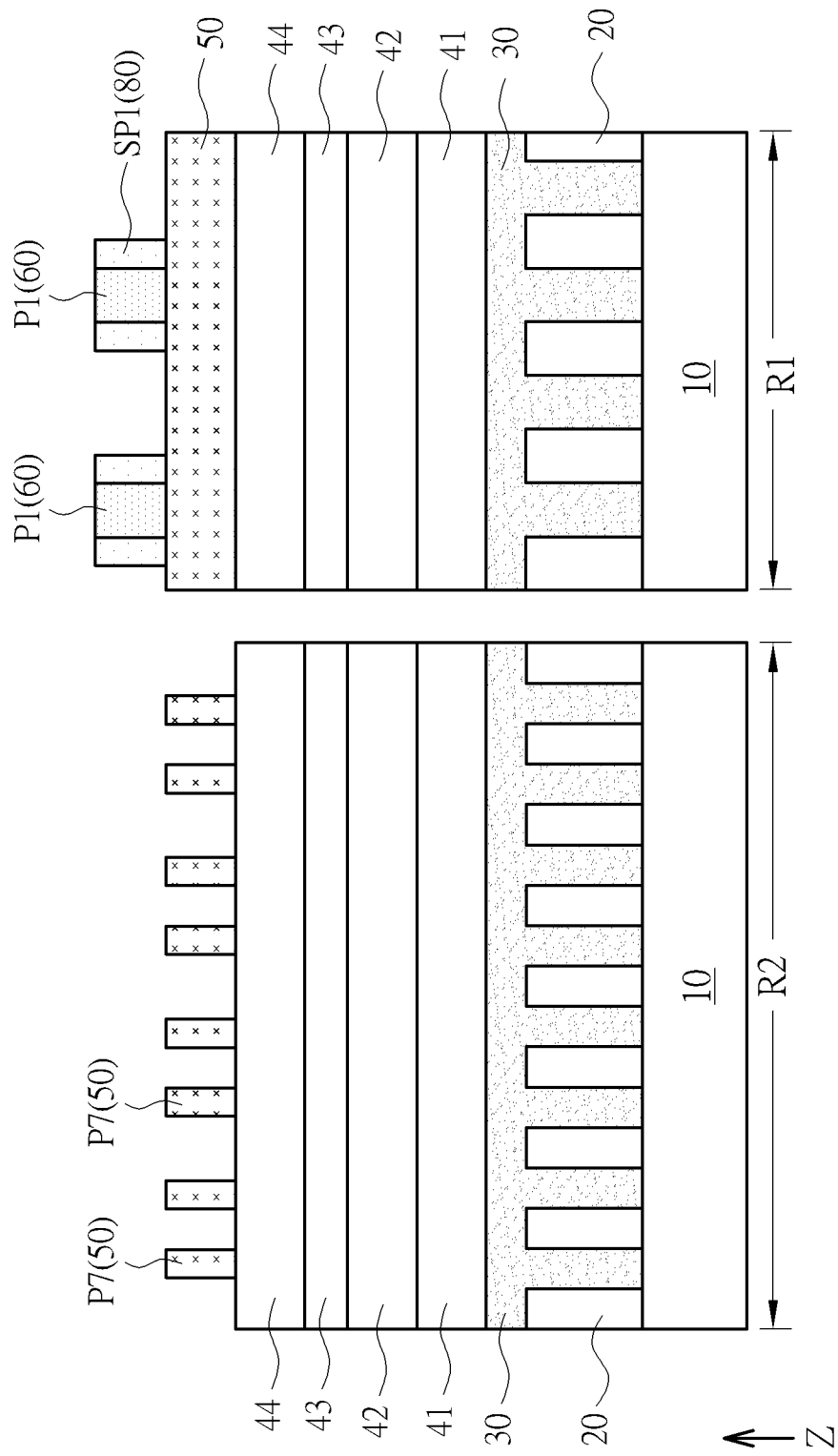
FIG. 6B is a cross-sectional diagram taken along a cross-sectional line A-A' and a cross-sectional line B-B' in FIG. 6A.
Figure 7A:
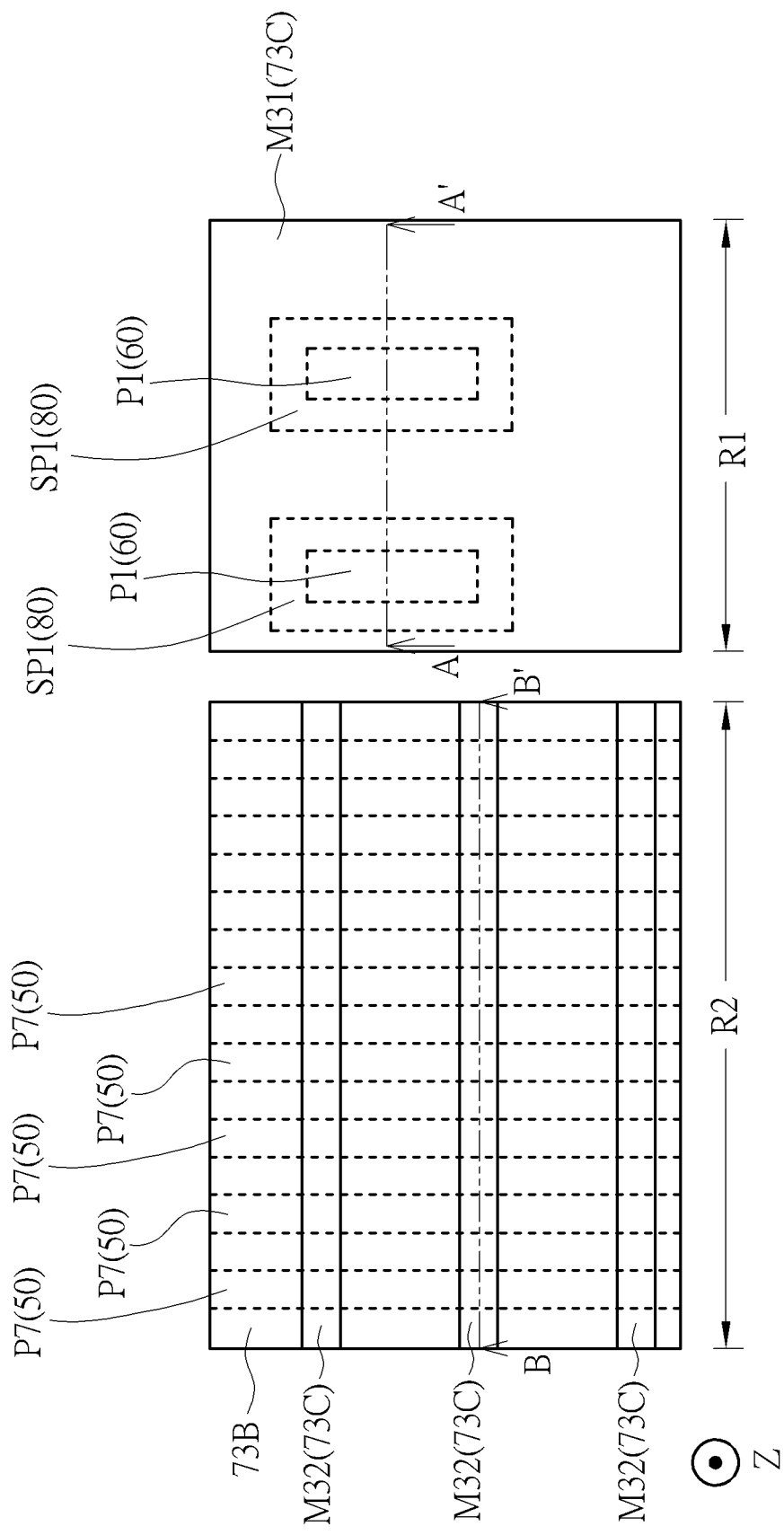
FIG. 7A is a schematic drawing in a step subsequent to FIG. 6A.
Figure 7B:
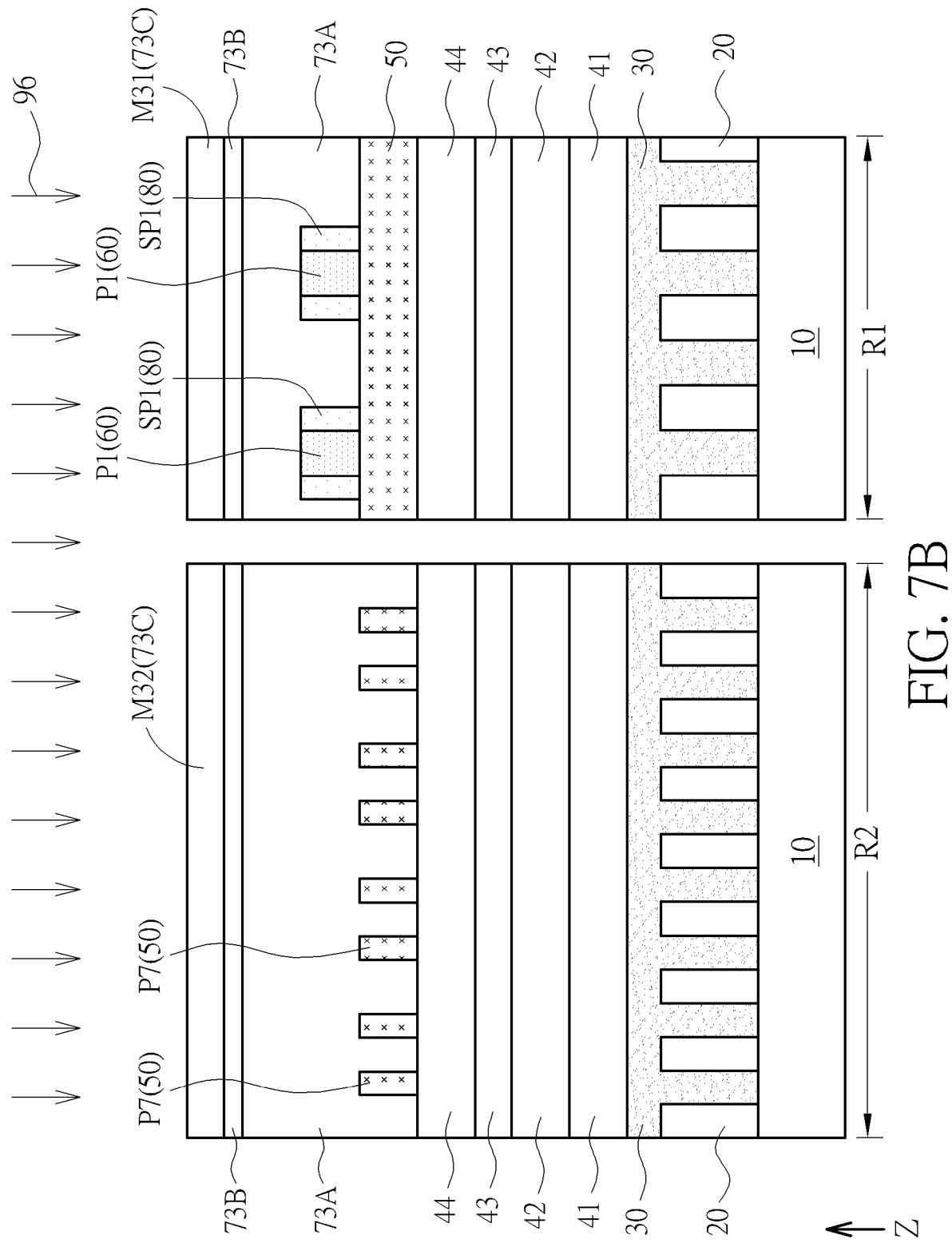
FIG. 7B is a cross-sectional diagram taken along a cross-sectional line A-A' and a cross-sectional line B-B' in FIG. 7A.
Figure 8A:
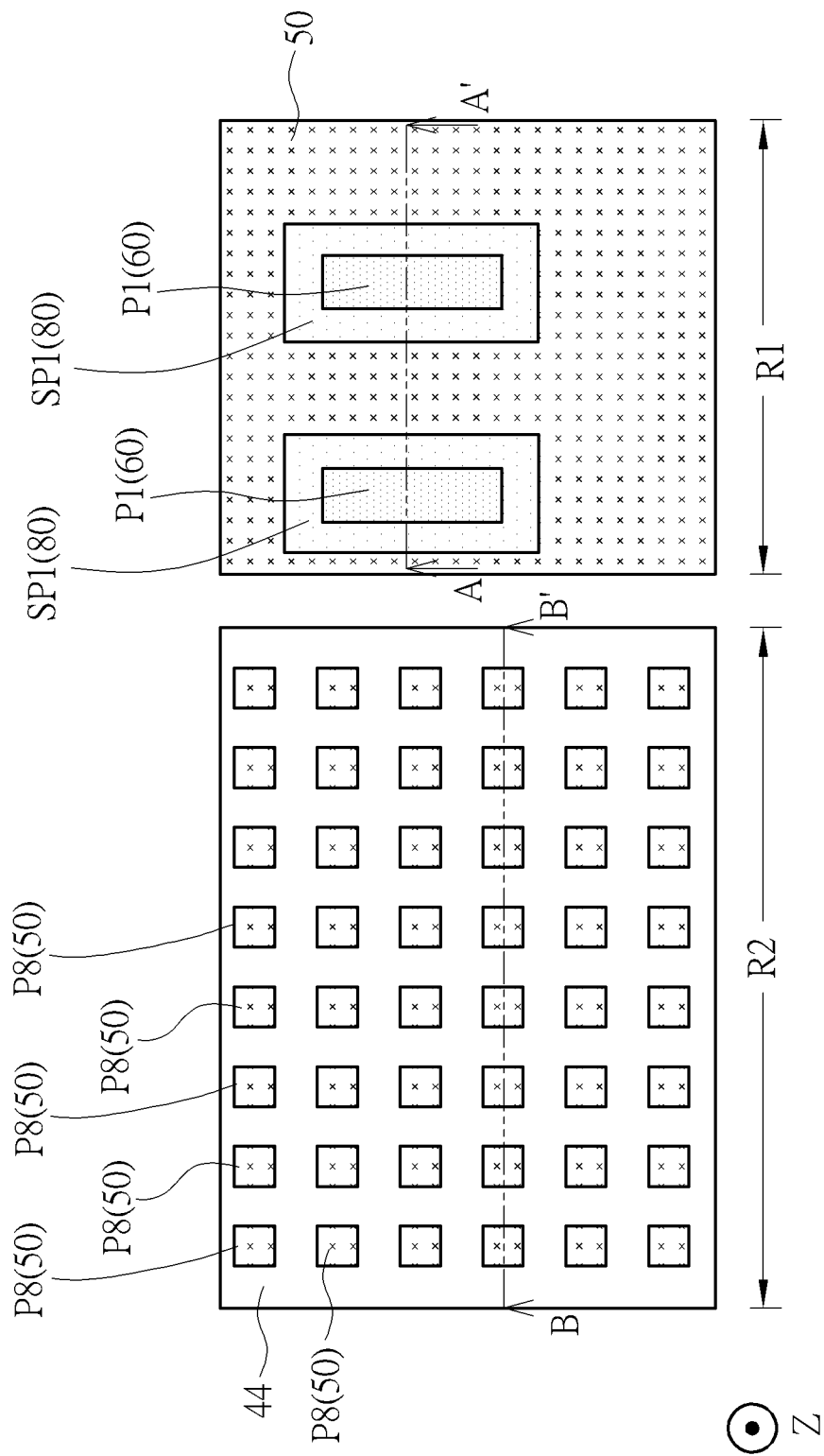
FIG. 8A is a schematic drawing in a step subsequent to FIG. 7A.
Figure 8B:
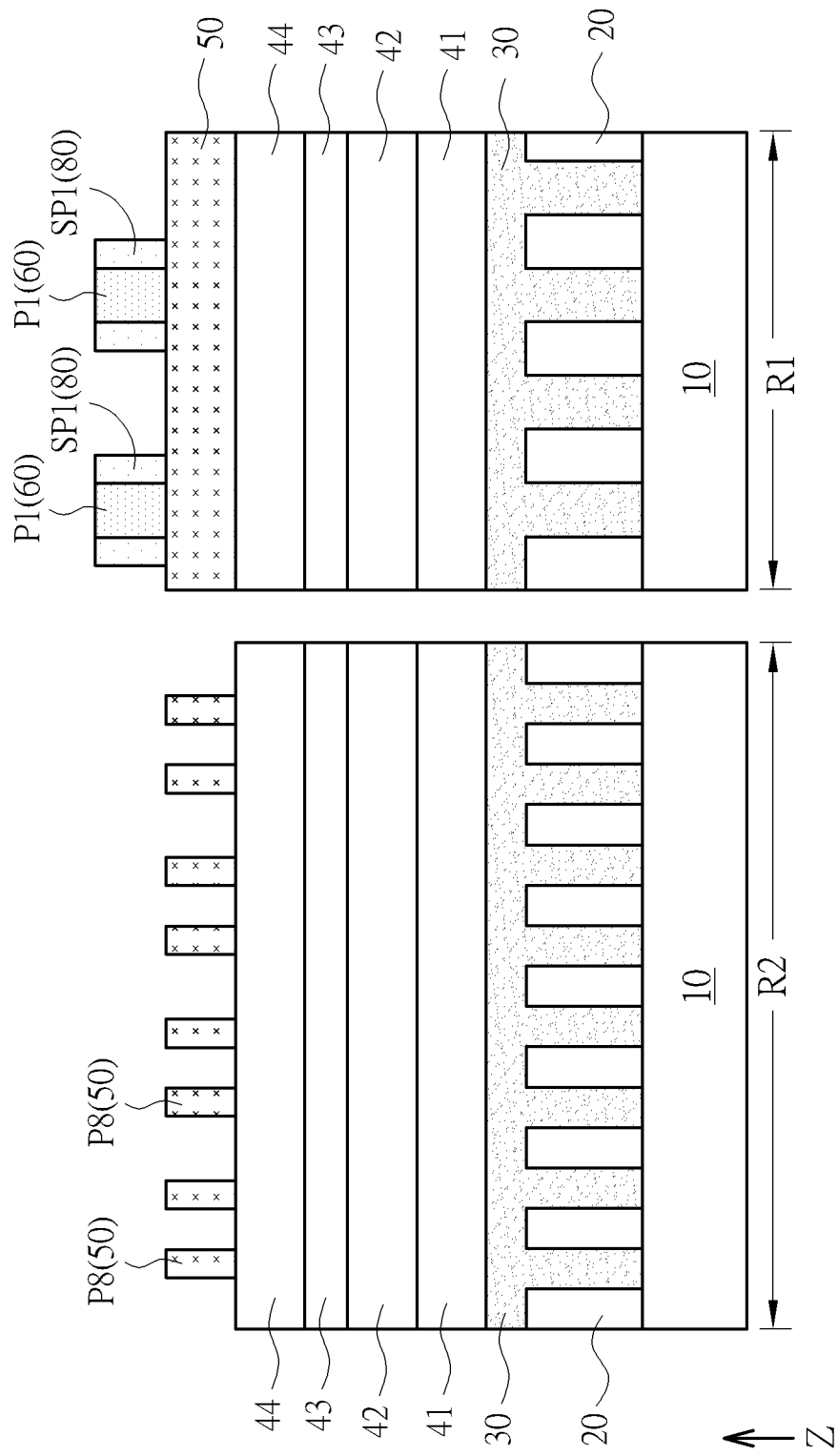
FIG. 8B is a cross-sectional diagram taken along a cross-sectional line A-A' and a cross-sectional line B-B' in FIG. 8A.
Figure 16A:
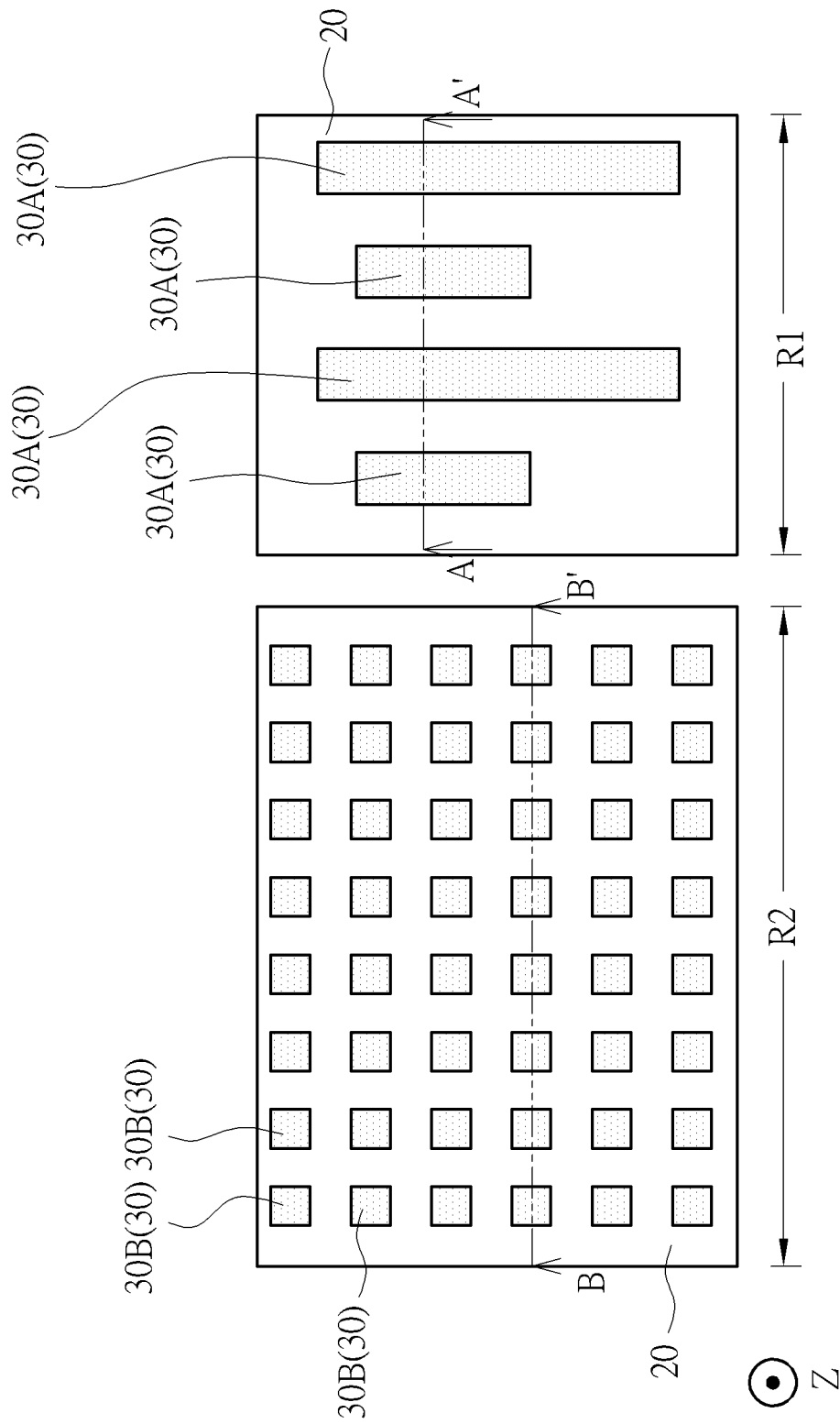
Figure 16B:
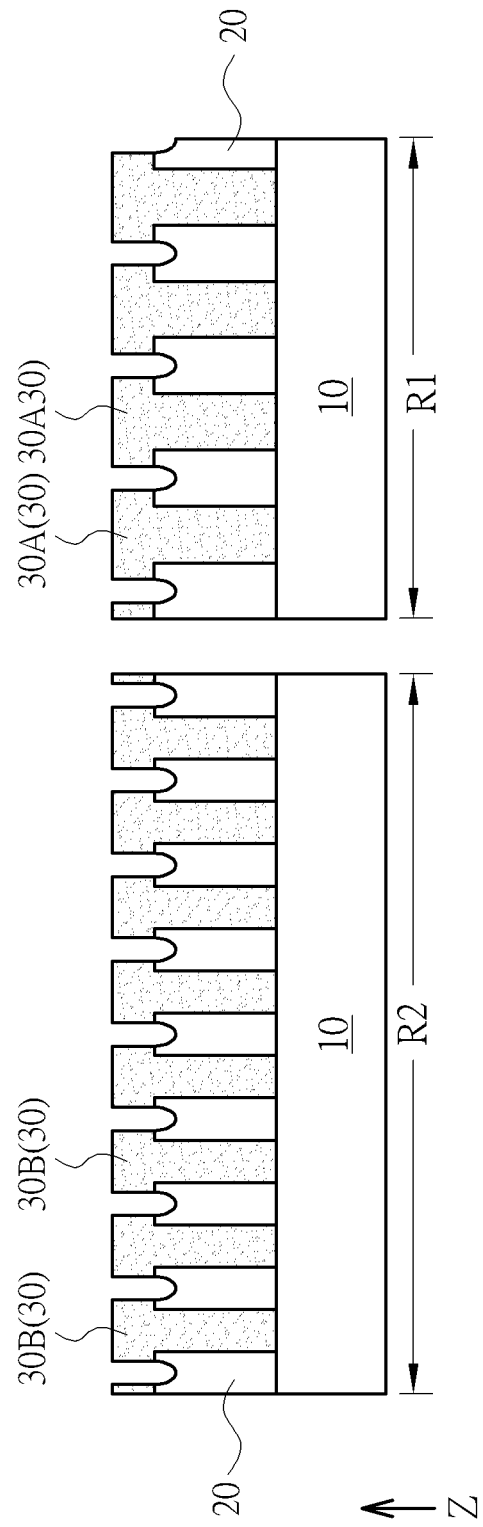

By the fabricating method in this embodiment, a patterned structure shown in FIG. 16A and FIG. 16B and including the first material layer pattern 30A and the second material layer pattern 30B may be formed. It is worth noting that, as shown in FIGS. 9A-11A, FIGS. 9B-11B, FIG. 12, FIG. 13, FIG. 14A, and FIG. 14B, the third pattern P3 and the fourth pattern P4 may be formed separately from each other by disposing the first spacer SP1, and the self-aligned formation may be obtained. Accordingly, the purposes of enhancing the manufacturing yield and improving the process window may be achieved. Additionally, as shown in FIG. 2A and FIG. 2B, the first pattern P1 on the first region R1 and the sixth pattern P6 on the second region R2 may be formed by the same photomask and the same patterning process for reducing the total photomask amount and lowering the manufacturing cost. In addition, the fifth patterning process 95 shown in FIG. 5B described above and the sixth patterning process 96 shown in FIG. 7B described above may be performed before the second patterning process 92 shown in FIG. 9B described above, but the present invention is not limited thereto. In some embodiments, the fifth patterning process 95 and the sixth patterning process 96 may be performed after the second patterning process 92 according to other considerations.

Figure 17:
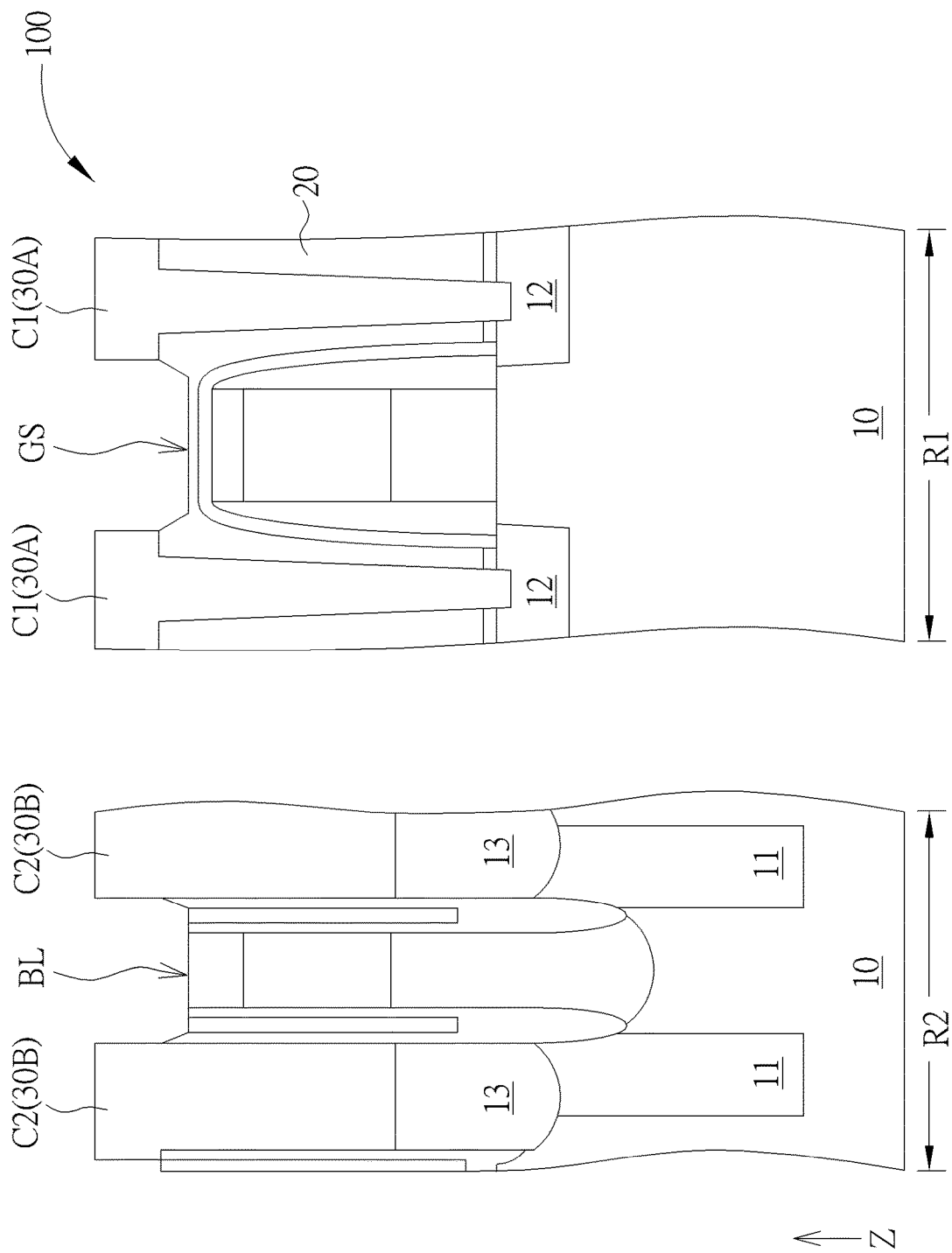
FIG. 17 is a schematic drawing illustrating a semiconductor memory device formed by the method of fabricating the patterned structure according to the first embodiment of the present invention.

Please refer to FIG. 16A, FIG. 16B, and FIG. 17. FIG. 17 is a schematic drawing illustrating a semiconductor memory device 100 formed by the method of fabricating the patterned structure according to the first embodiment of the present invention. As shown in FIG. 16A, FIG. 16B, and FIG. 17, in some embodiments, the semiconductor memory device 100 may include the substrate 10, a shallow trench isolation 11, source/drain regions 12, a gate structure GS, a bit line structure BL, the insulation layer 20, a storage node contact 13, a storage node contact pad C2, and a connection structure C1. The shallow trench isolation 11 is disposed in the substrate 10 for defining a plurality of active areas. The bit line structure BL, the storage node contact 13, and the storage node contact pad C2 may be disposed on the second region R2, and the source/drain regions 12, the gate structure GS, and the connection structure C1 may be disposed on the first region R1. In some embodiments, the second region R2 may include a memory cell region, and the first region R1 may include a peripheral region for forming peripheral circuit units (such as transistors for controlling signals transmitted to and from word lines and/or bit lines), but not limited thereto. The first material layer pattern 30A described above may include the connection structure C1 in the semiconductor memory device 100, and the second material layer pattern 30B described above may include the storage node contact pad C2 in the semiconductor memory device 100. In other words, in some embodiments, the material layer 30 on the first region R1 may be patterned to be the connection structure C1 on a transistor (such as a transistor including the source/drain regions 12 and the gate structure GS mentioned above) by the fourth patterning process described above, and the material layer 30 on the second region R2 may be patterned to be the storage node contact pad C2 by the fourth patterning process described above, but bit limited thereto. In addition, the method of fabricating the patterned structure in the present invention may also be applied for forming patterned structures in other types of semiconductor devices according to other considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9A:
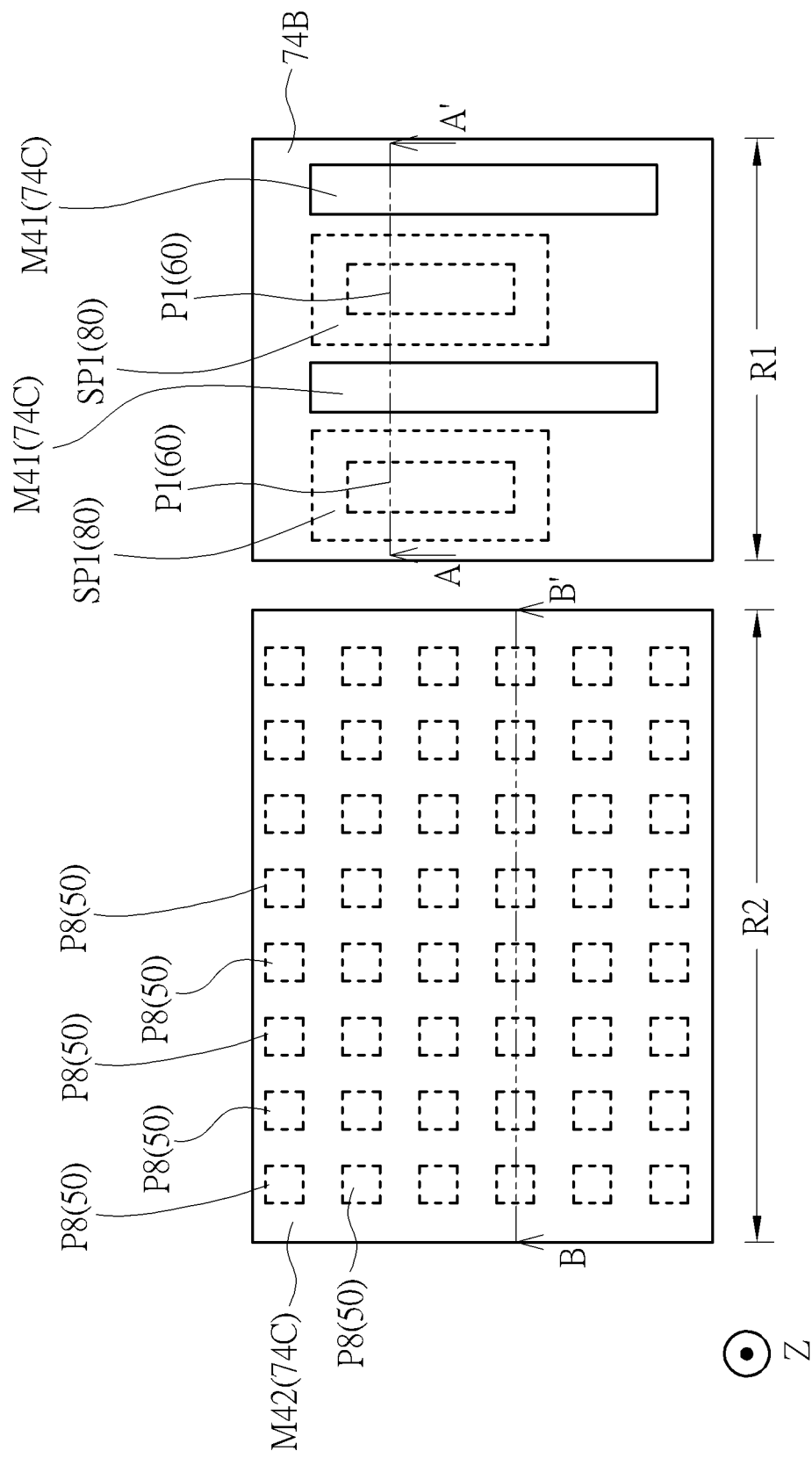
FIG. 9A is a schematic drawing in a step subsequent to FIG. 8A.
Figure 9B:
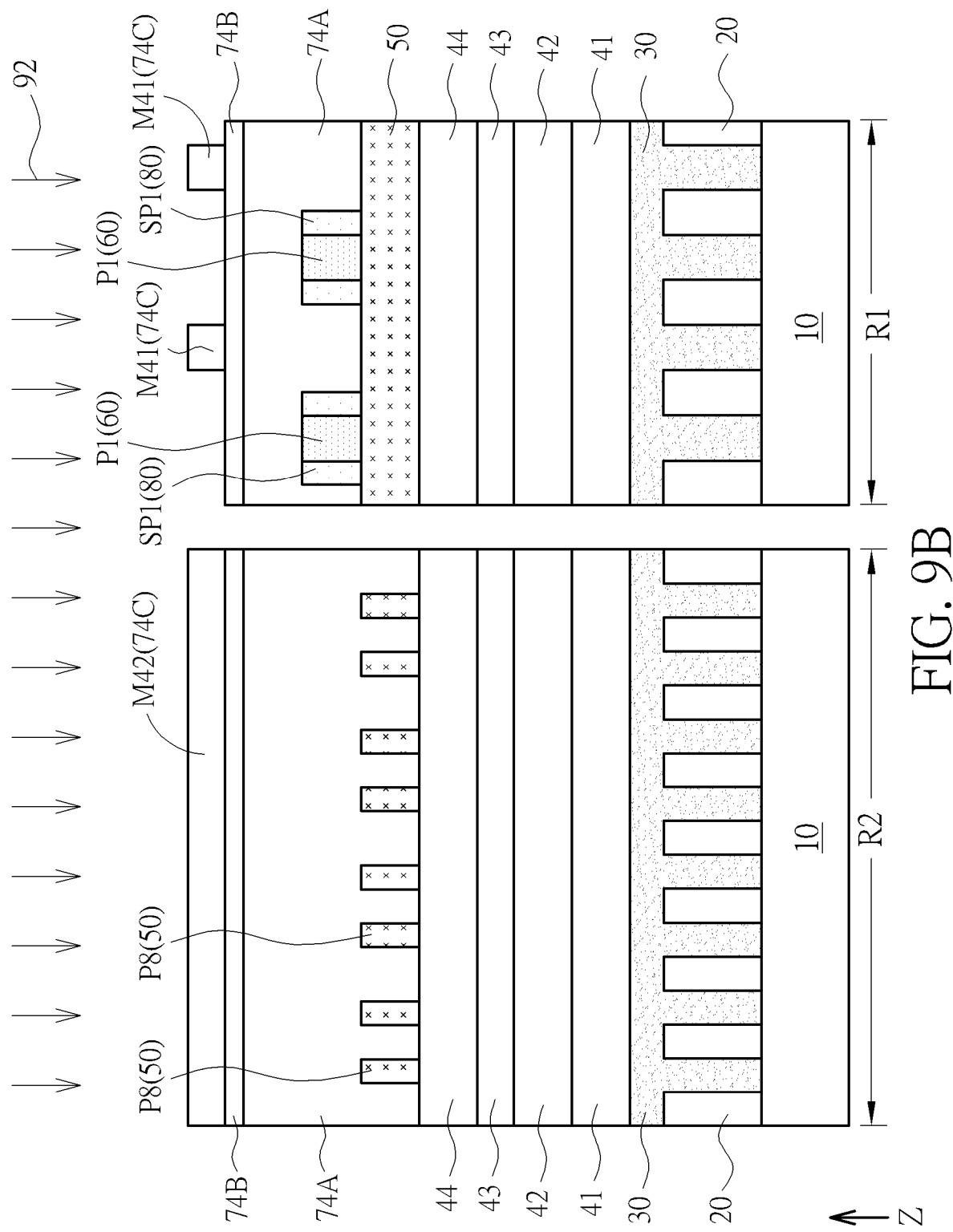
FIG. 9B is a cross-sectional diagram taken along a cross-sectional line A-A' and a cross-sectional line B-B' in FIG. 9A.
Figure 10A:
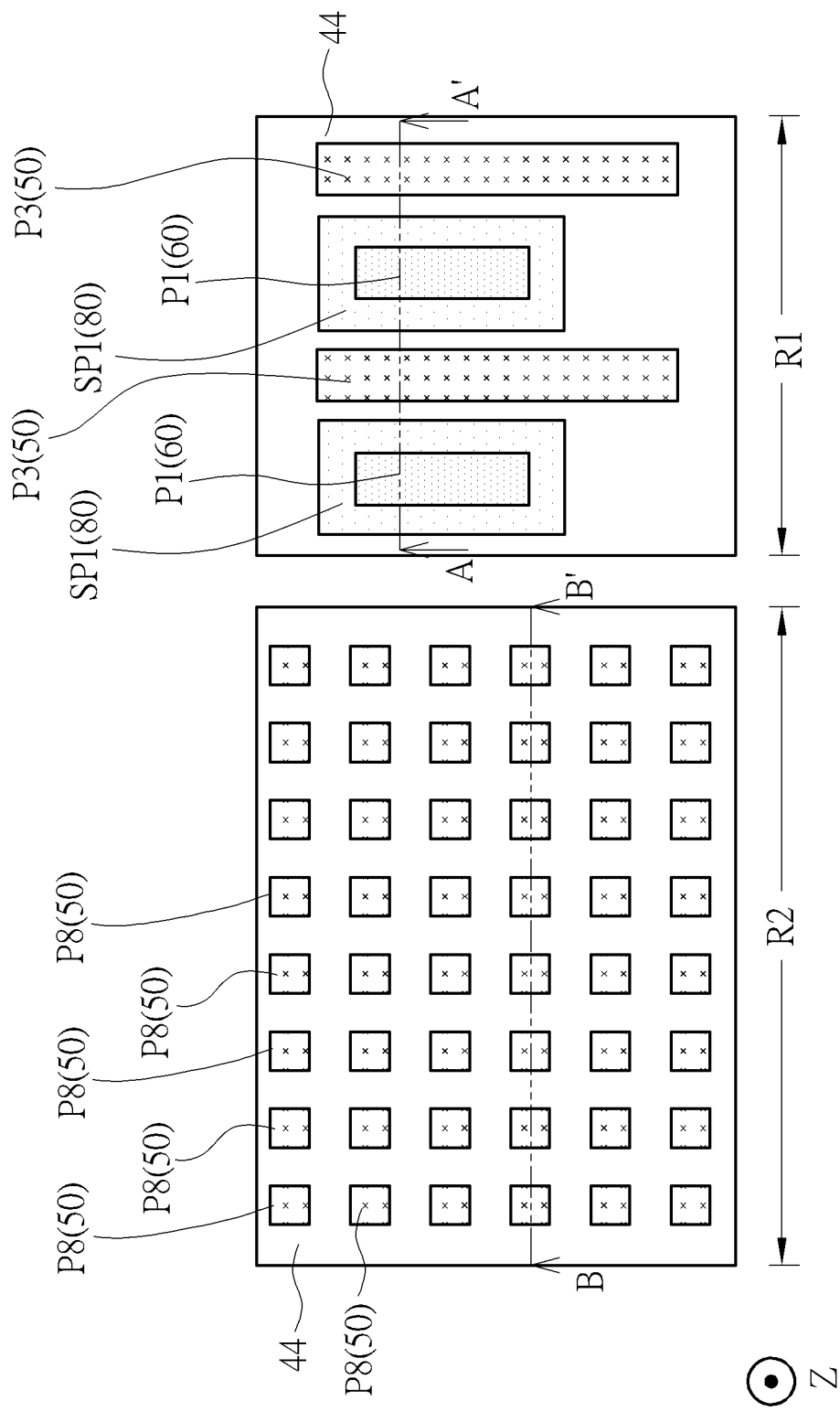
FIG. 10A is a schematic drawing in a step subsequent to FIG. 9A.
Figure 10B:
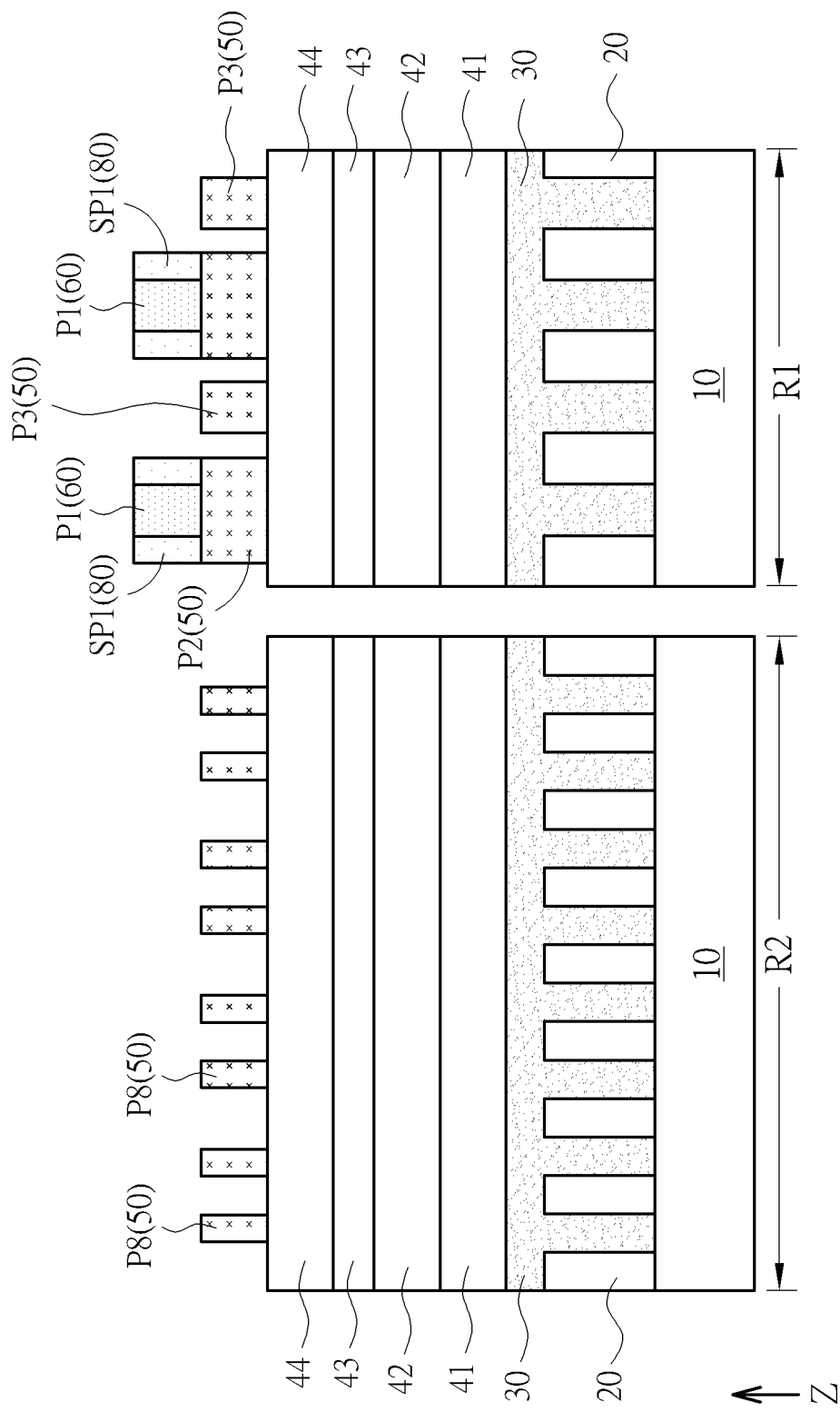
FIG. 10B is a cross-sectional diagram taken along a cross-sectional line A-A' and a cross-sectional line B-B' in FIG. 10A.
Figure 18A:
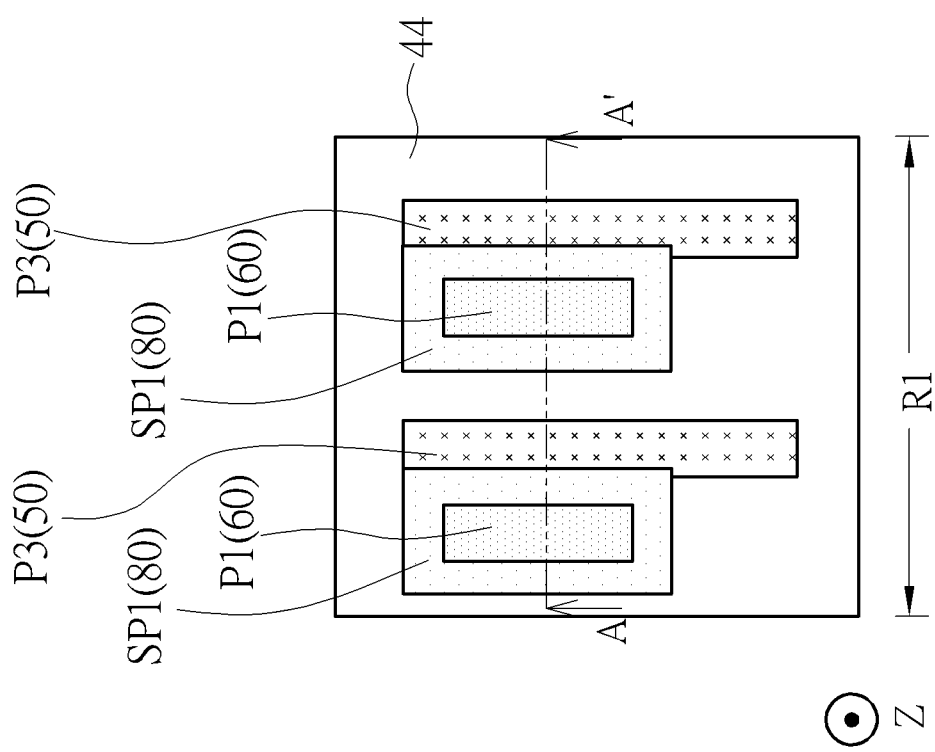
Figure 18B:
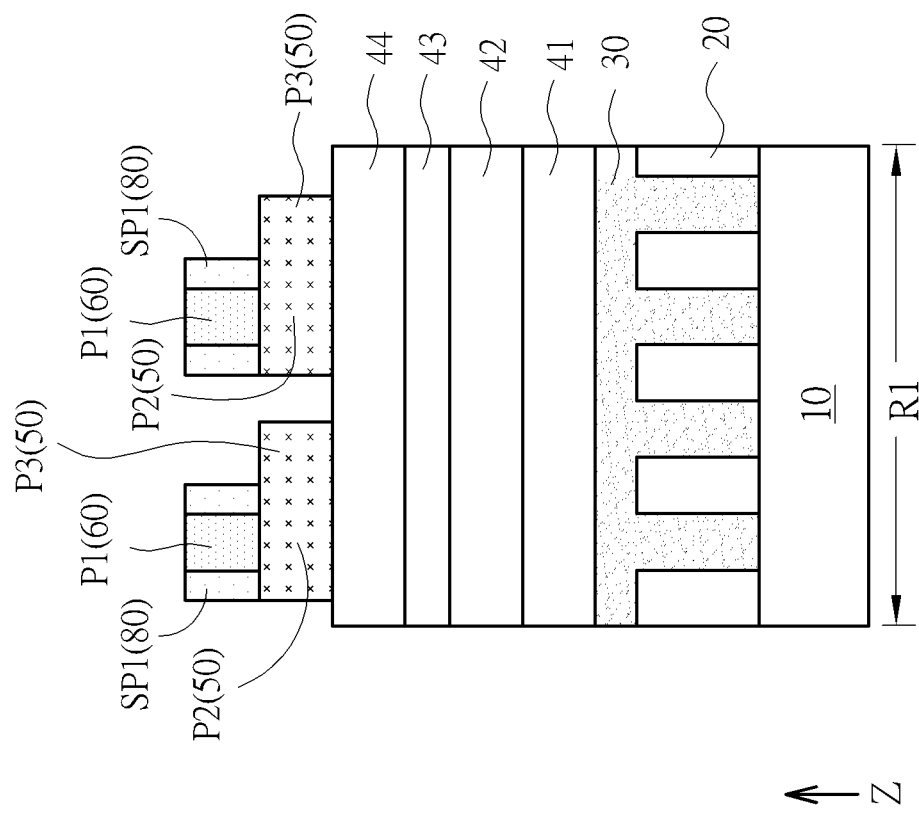
Figure 19A:
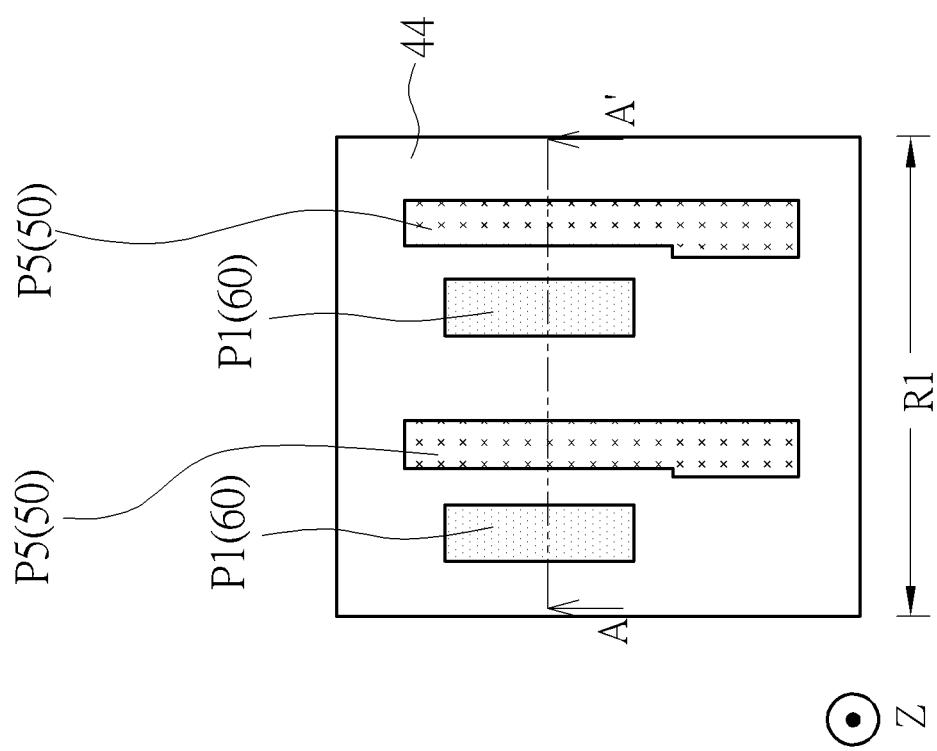
Figure 19B:
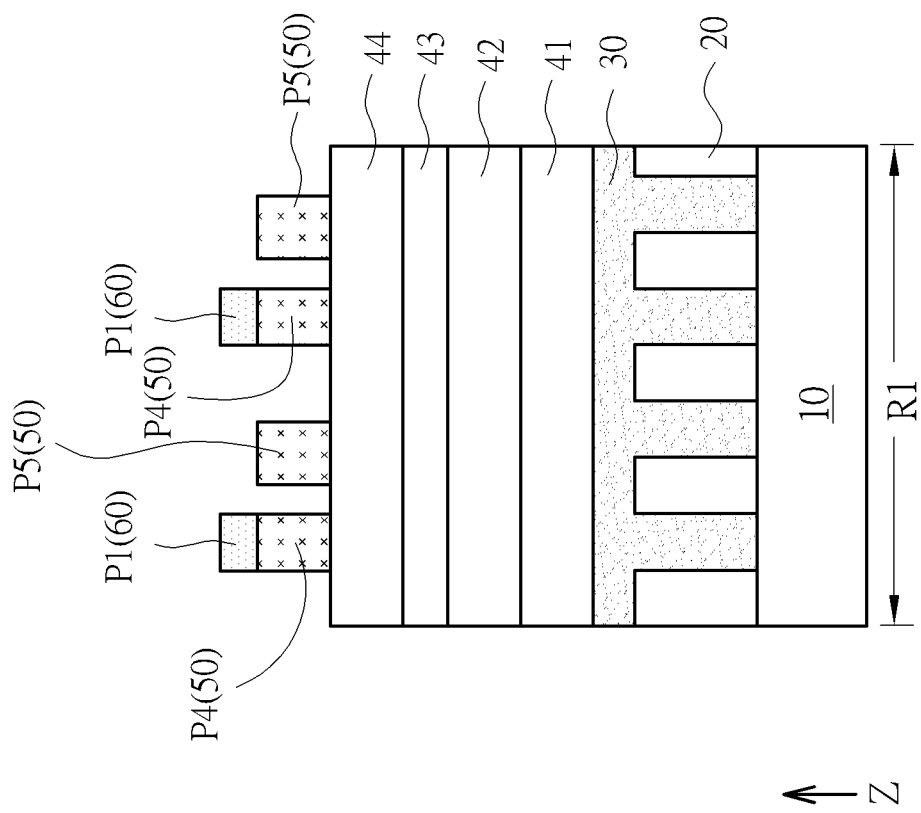
Figure 20:
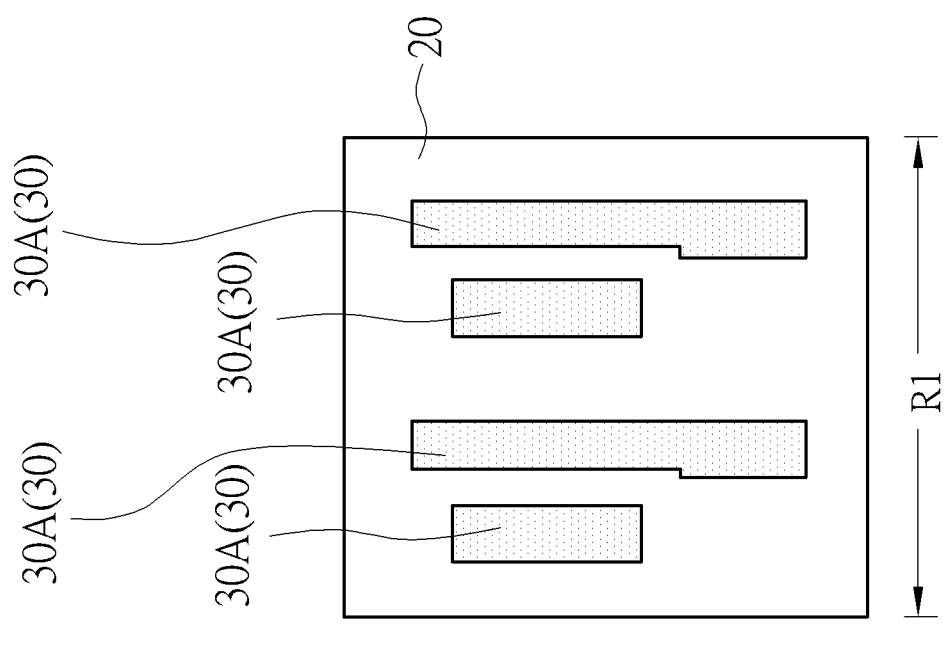

Please refer to FIG. 18A, FIG. 18B, FIG. 19A, FIG. 19B, and FIG. 20, and please refer to FIG. 9A, FIG. 9B, FIG. 11A, FIG. 11B, FIG. 12, and FIG. 13 also. FIG. 18A, FIG. 18B, FIG. 19A, FIG. 19B and FIG. 20 are schematic drawings illustrating a method of fabricating a patterned structure according to a second embodiment of the present invention. FIG. 18A, FIG. 19A, and FIG. 20 are top view diagrams. FIG. 18B and FIG. 19B are cross-sectional diagrams taken along cross-sectional lines A-A' in FIG. 18A and FIG. 19A respectively. In addition, FIG. 18A and FIG. 18B may be regarded as schematic drawings in a step subsequent to FIG. 9A and FIG. 9B, and FIG. 18A and FIG. 18B may be regarded as a result when the sixth photoresist pattern M41 in FIG. 9A and FIG. 9B is misaligned and overlaps the first spacer SP1. As shown in FIG. 9A, FIG. 9B, FIG. 18A, and FIG. 18B, the second pattern P2 and the third pattern P3 may be formed and connected with one another when the sixth photoresist pattern M41 is misaligned and overlaps the first spacer SP1. Subsequently, the third patterning process 93 described in FIG. 11A, FIG. 11B, FIG. 12, and FIG. 13 mentioned above may be performed for forming the fourth pattern P4 and a fifth pattern P5 shown in FIG. 19A and FIG. 19B. In other words, the third pattern P3 shown in FIG. 18A and FIG. 18B may be patterned to be the fifth pattern P5 by the third patterning process 93 in this embodiment. The fifth pattern P5 and the fourth pattern P4 may be formed and separated from one another when the corresponding photoresist pattern (such as the sixth photoresist pattern M41 described above) is misaligned because of the arrangement of the first spacer SP1. As shown in FIG. 19A, FIG. 19B, and FIG. 20, the fourth patterning process 94 shown in FIG. 14B described above may then be performed for transferring the fourth pattern P4 and the fifth pattern P5 to the material layer 30. In other words, in this embodiment, the projection pattern of the first material layer pattern 30A in the thickness direction Z of the substrate 10 may be corresponding to and similar to the projection pattern of the fourth pattern P4 or the fifth pattern P5 in the thickness direction Z of the substrate 10. However, in comparison with the first embodiment described above, the shape the first material layer pattern 30A corresponding to the fifth pattern in this embodiment may be different because of the misalignment of the photoresist pattern described above. Additionally, the flexibility of the corresponding layout pattern design may be increased by the self-aligned property of the fabricating method in the present invention. For example, a process window of a shape variation of a layout pattern corresponding to the sixth photoresist pattern M41 described above may be increased accordingly, but not limited thereto.

Figure 13:
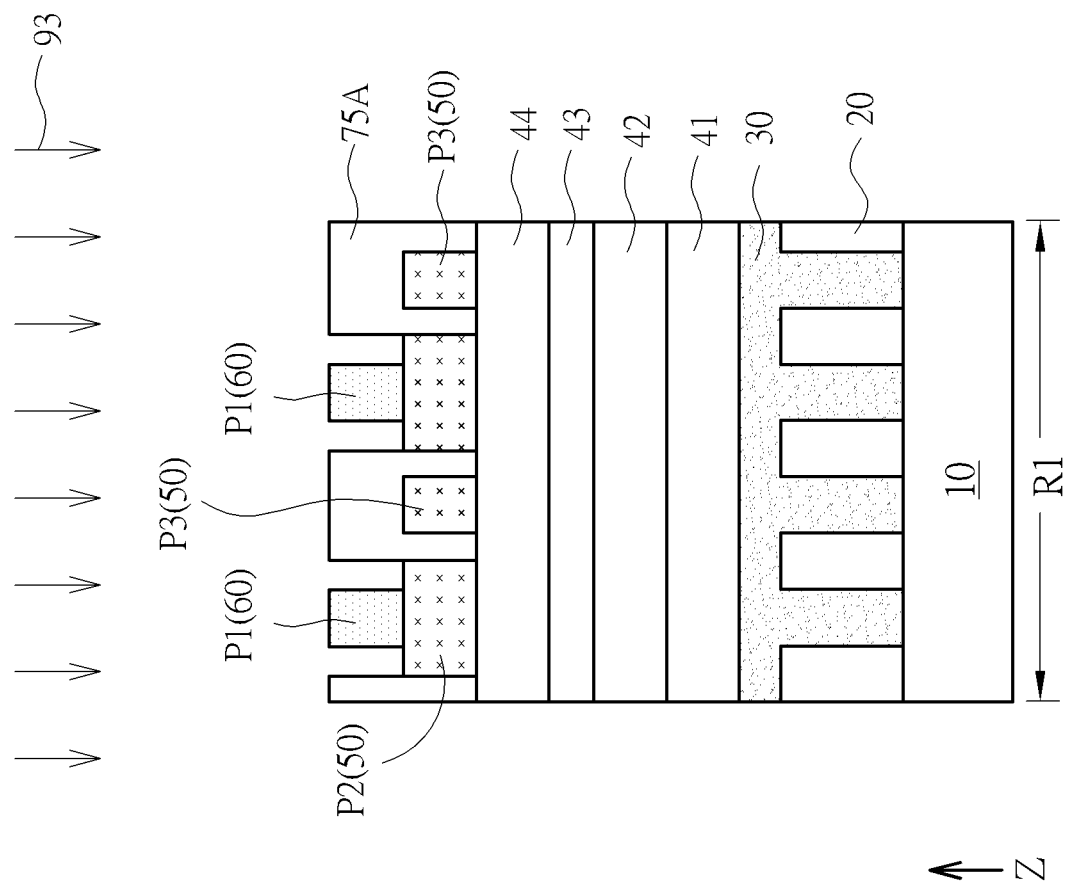
Figure 14A:
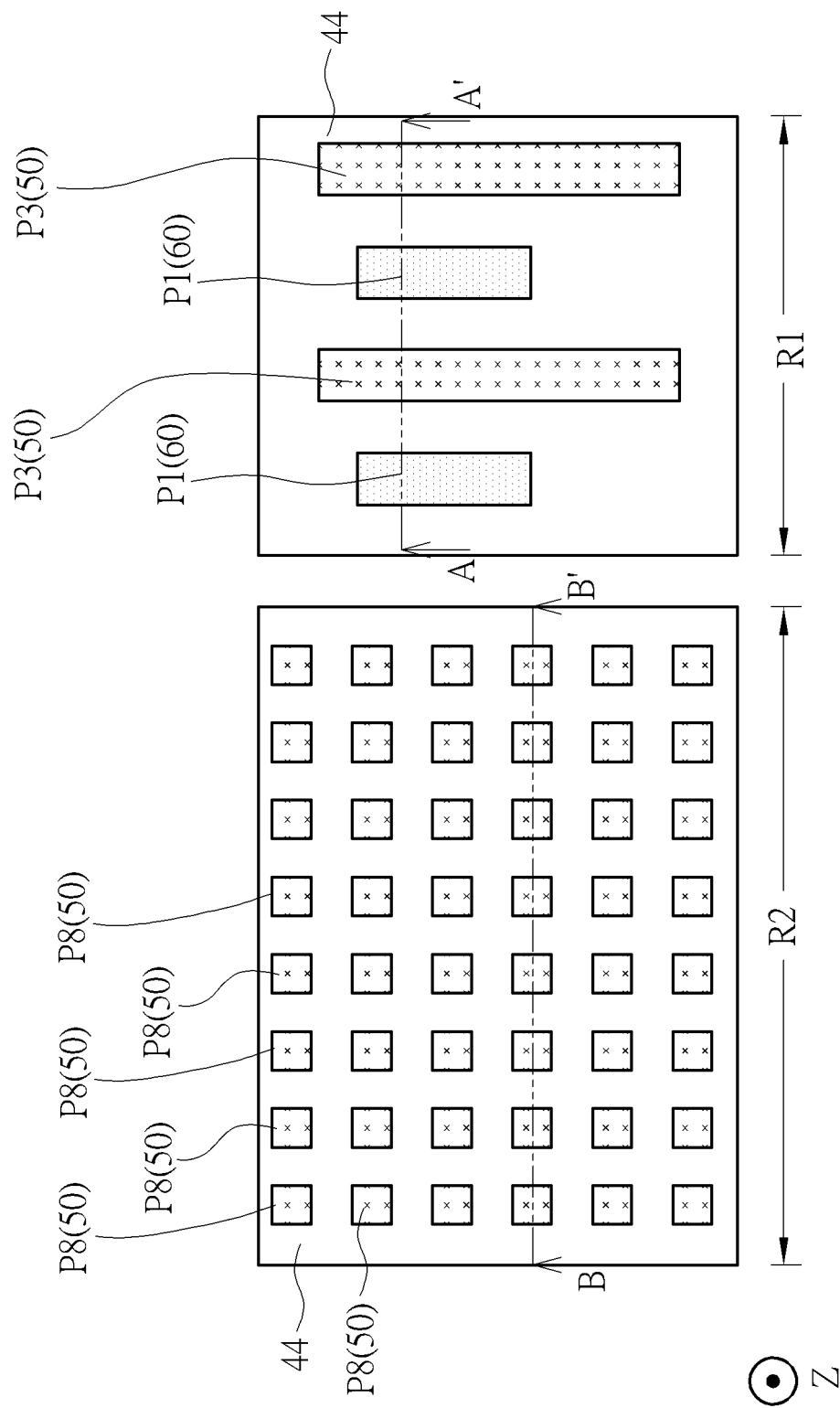
Figure 14B:
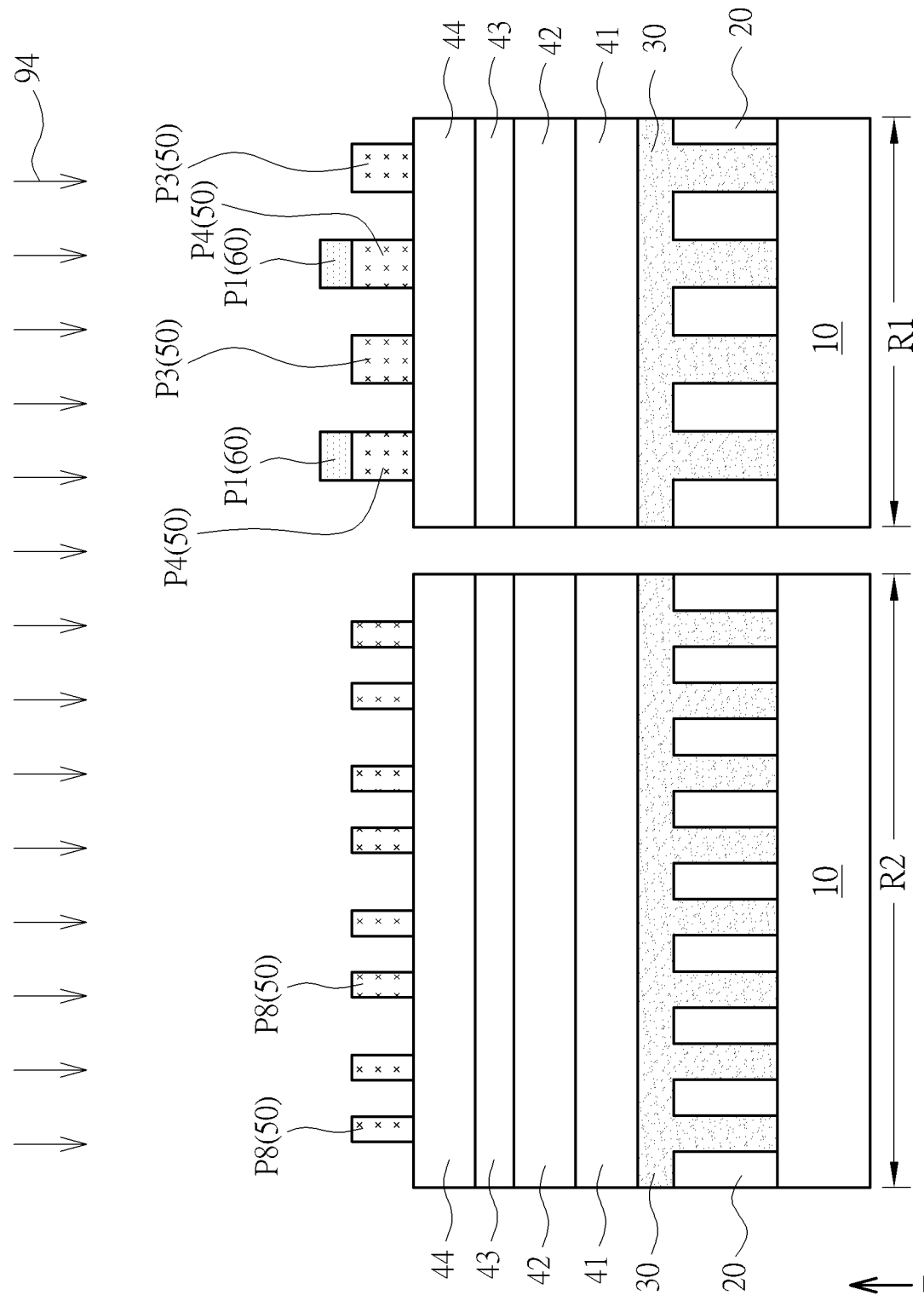
Figure 15A:
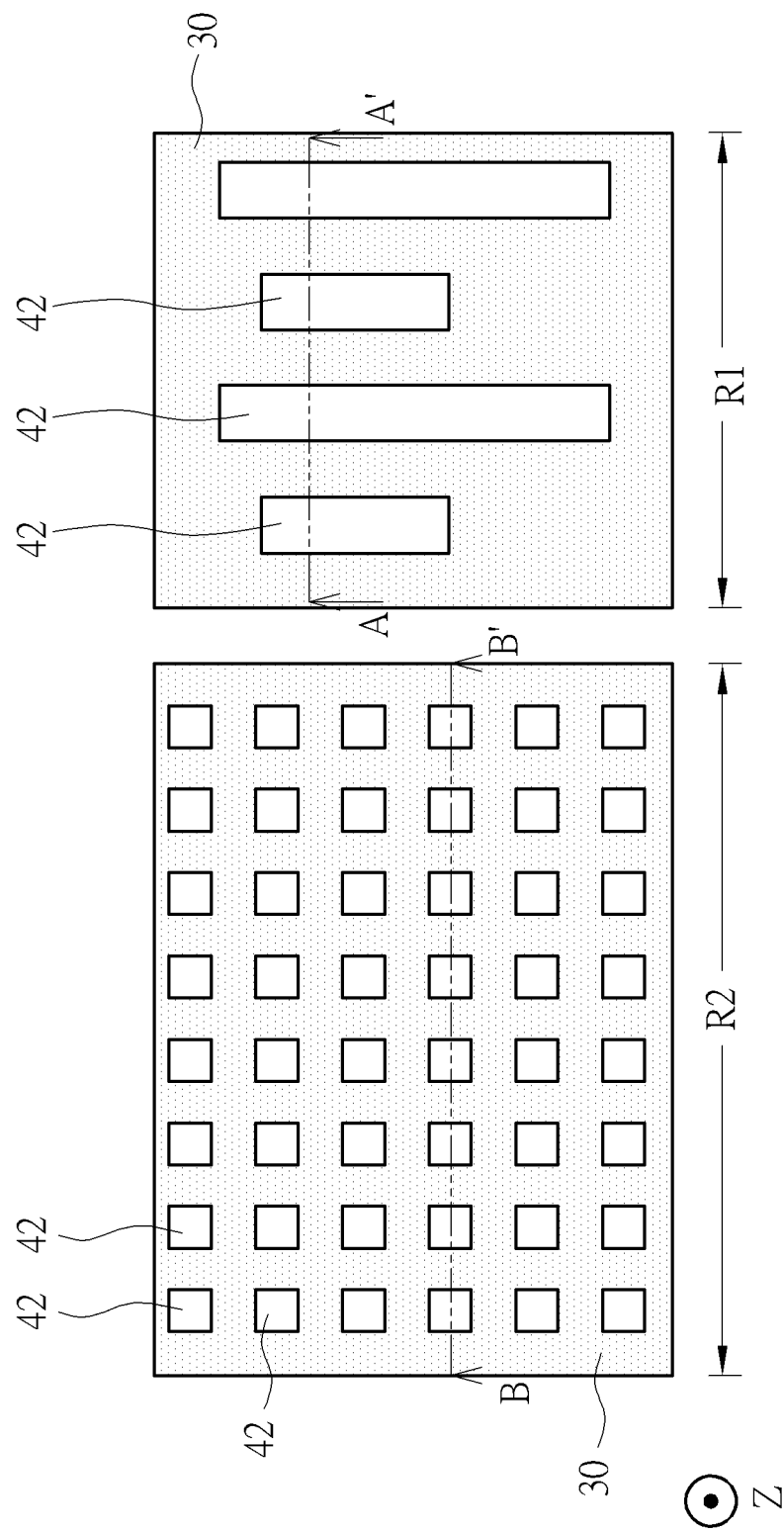
FIG. 15A is a schematic drawing in a step subsequent to FIG. 14A.
Figure 15B:
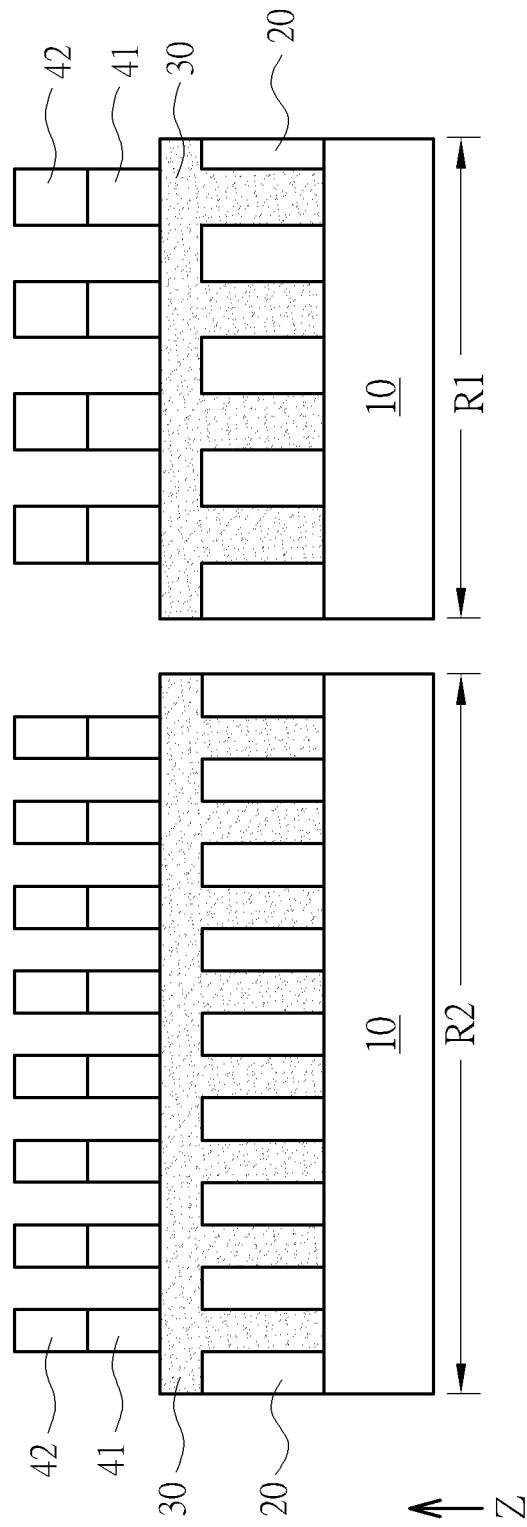
FIG. 15B is a cross-sectional diagram taken along a cross-sectional line A-A' and a cross-sectional line B-B' in FIG. 15A.
Figure 21:
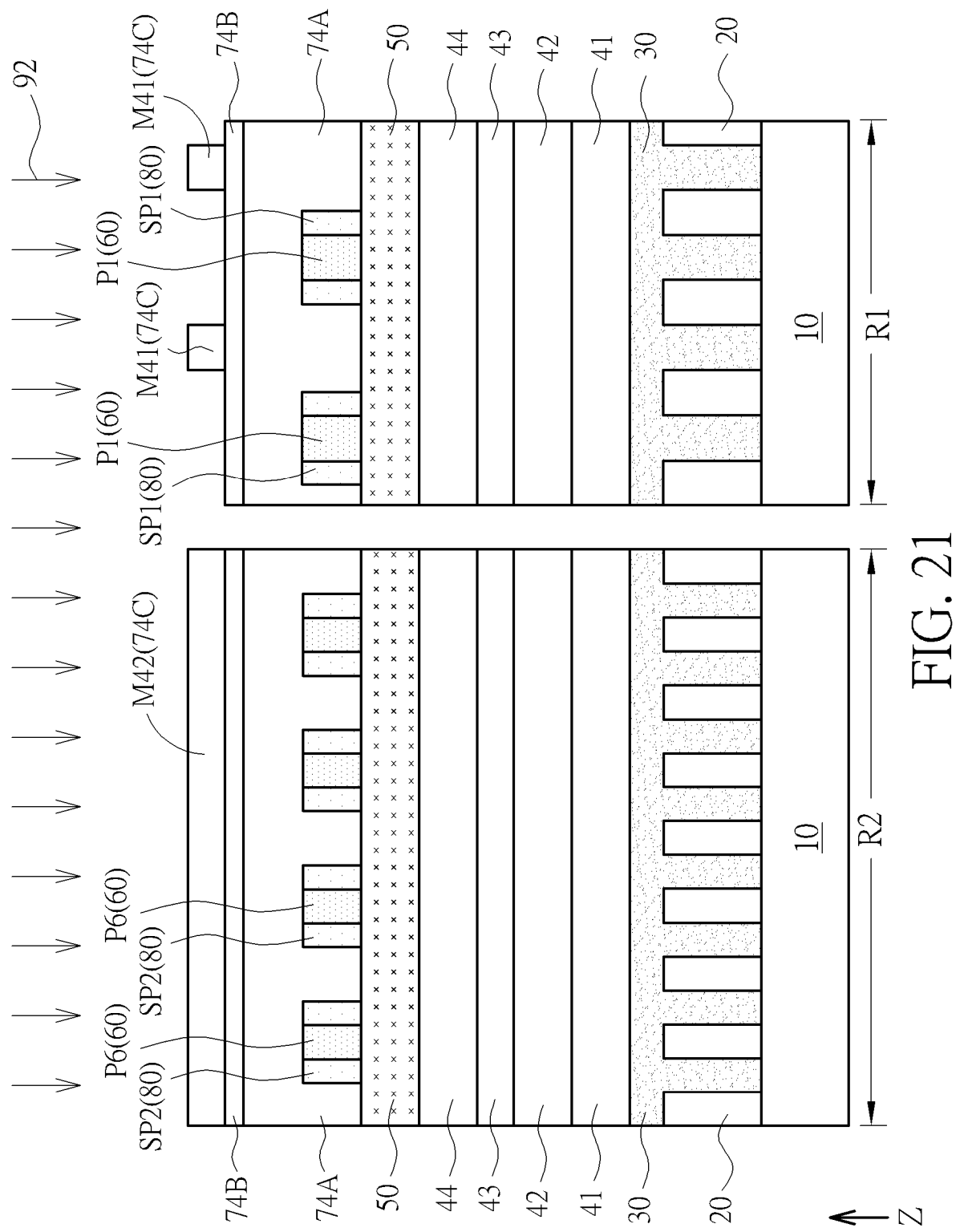
Figure 22:
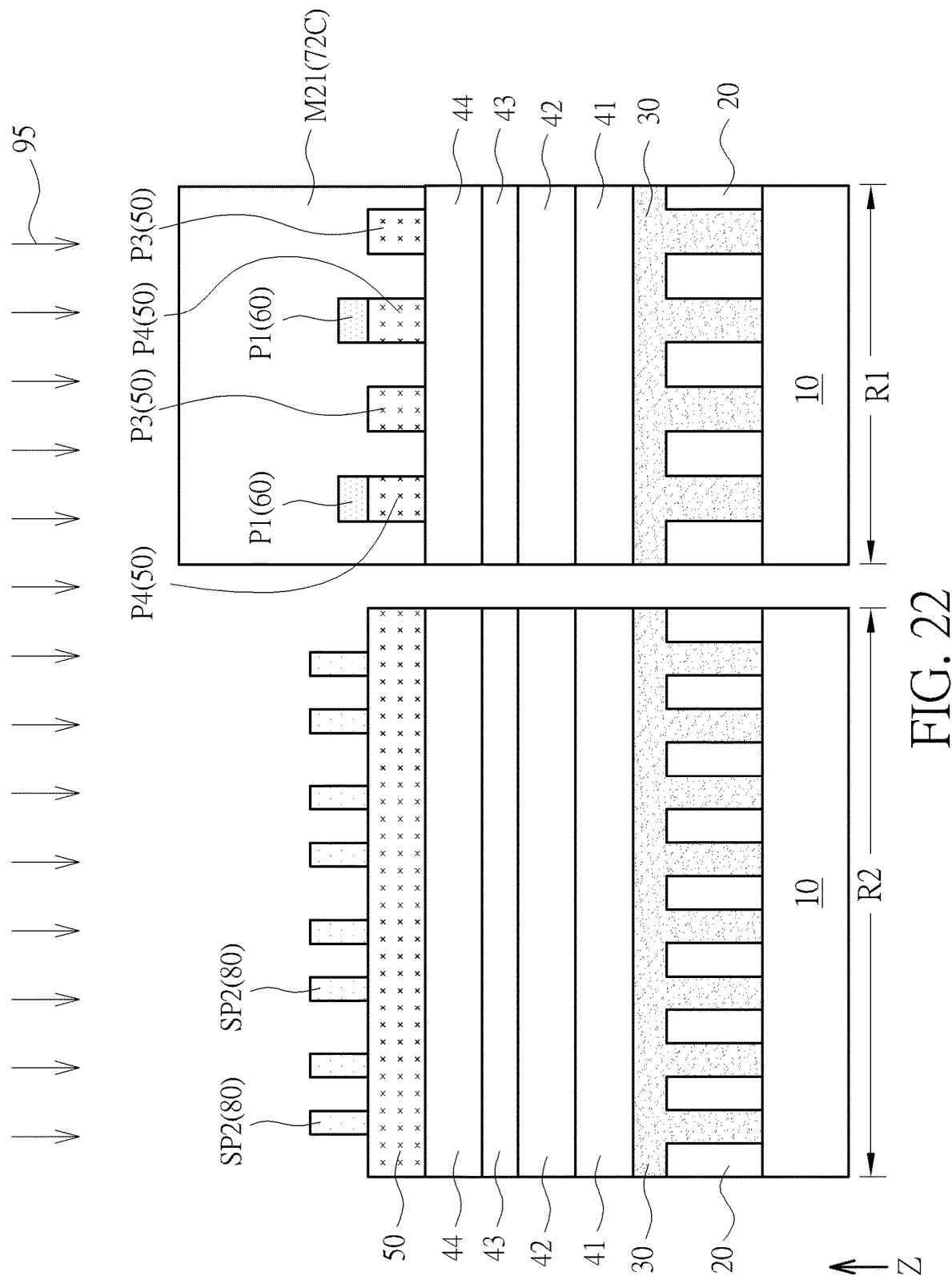

Please refer to FIG. 21, FIG. 22, and FIG. 13. FIG. 21 and FIG. 22 are schematic drawings illustrating a method of fabricating a patterned structure according to a third embodiment of the present invention. FIG. 22 is a schematic drawing in a step subsequent to FIG. 21, and FIG. 13 may be regarded as a schematic drawing of the first region R1 in a step subsequent to FIG. 21 and before FIG. 22. As shown in FIG. 21, FIG. 13, and FIG. 22, in the method of fabricating the patterned structure, the fourth dielectric layer 74A, the fourth anti-reflection layer 74B, and the seventh photoresist pattern M42 may cover the second region R2, the sixth pattern P6 on the second region R2, and the second spacer SP2 on the second region R2 in the second patterning process 92 for providing a protective effect. Subsequently, the third patterning process 93 is performed after the second patterning process 92, and the fifth patterning process 95 is performed after the third patterning process 93. In the fifth patterning process 95, the third photoresist pattern M21 may cover the first pattern P1, the third pattern P3, and the fourth pattern P4 on the first region for providing a protective effect. Subsequently, the sixth patterning process 96 shown in FIG. 7B described above may be performed. Therefore, the sixth patterning process 96 may be performed after the third patterning process 93 in this embodiment.

Figure 23:
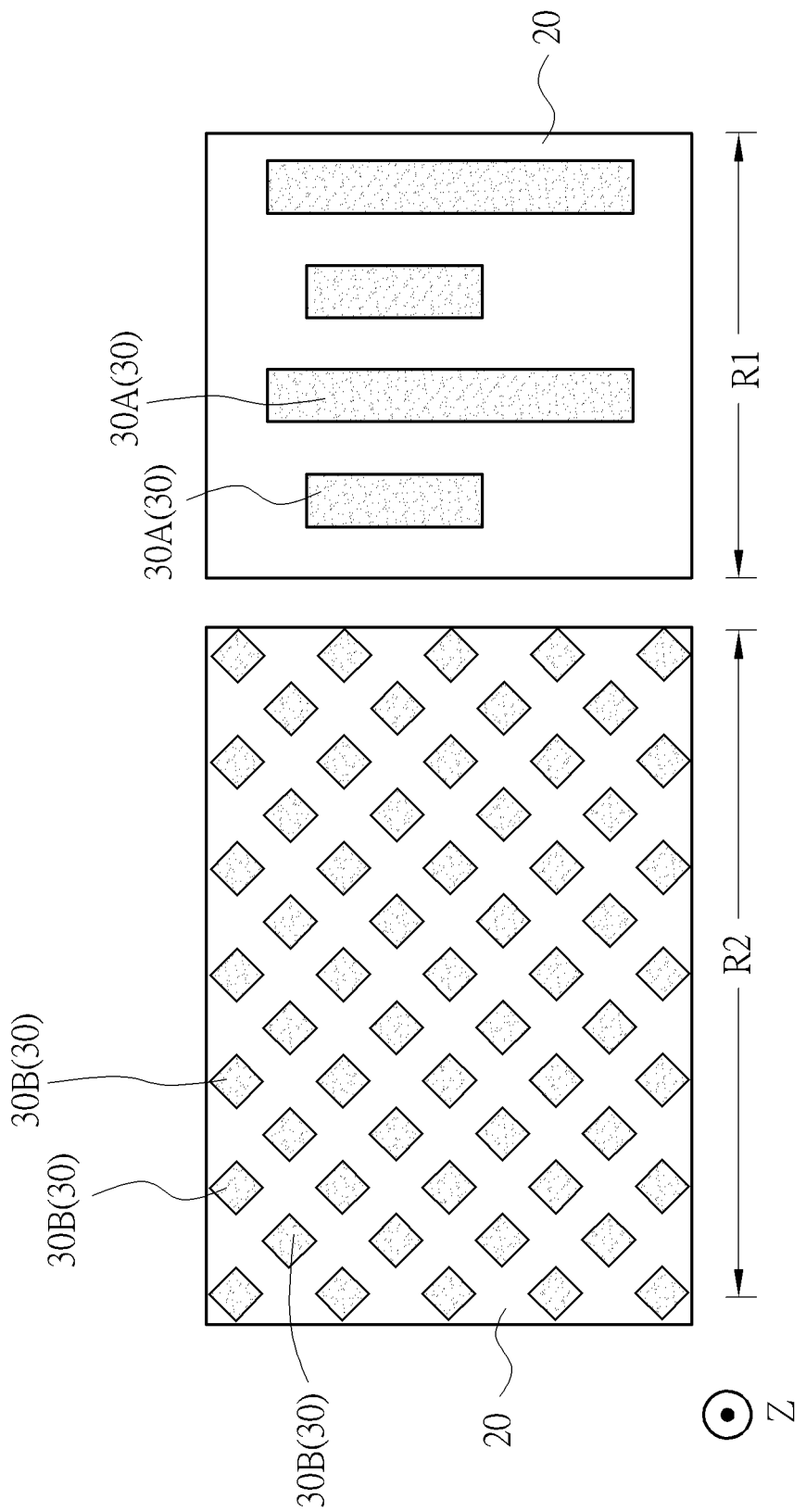
FIG. 23 is a schematic drawing illustrating a method of fabricating a patterned structure according to a third embodiment of the present invention.

Please refer to FIG. 23. FIG. 23 is a schematic drawing illustrating a method of fabricating a patterned structure according to a third embodiment of the present invention. As shown in FIG. 23, the shape and the arrangement of the second material layer pattern 30B may be different from those in the embodiments described above. For example, the shape of the second material layer pattern 30B may be a rhombus in a top view diagram, and a plurality of the second material layer patterns 30B may be repeatedly arranged in an oblique direction. Therefore, in the fabricating method of the present embodiment, the elongation directions of the photoresist patterns (such as the second photoresist pattern M12 shown in FIG. 1A described above and the fifth photoresist pattern M32 shown in FIG. 7A described above) used in the patterning process for forming the second material layer pattern 30B may not be parallel to and may not be perpendicular to the elongation directions of the photoresist patterns (such as the first photoresist pattern M11 shown in FIG. 1A described above and the sixth photoresist pattern M41 shown in FIG. 9A described above) used in the patterning process for forming the first material layer pattern 30A, but not limited thereto.

To summarize the above descriptions, in the method of fabricating the patterned structure according to the present invention, the self-aligned effect may be obtained by the arrangement of the first spacer, and the patterns formed by this method may be separated from one another still when the corresponding photoresist pattern is misaligned. The purposes of enhancing the manufacturing yield and improving the process window may be achieved accordingly. Additionally, the first pattern on the first region and the sixth pattern on the second region may be formed by the same photomask and the same patterning process for reducing the total photomask amount and lowering the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a patterned structure, comprising:
    forming a first pattern transfer layer on a material layer;
    forming a second pattern transfer layer on the first pattern transfer layer;
    performing a first patterning process to the second pattern transfer layer, wherein a part of the second pattern transfer layer is patterned to be a first pattern by the first patterning process;
    forming a first spacer on sidewalls of the first pattern;
    performing a second patterning process to the first pattern transfer layer after forming the first spacer, wherein the first pattern transfer layer is patterned to be a second pattern and a third pattern by the second patterning process, and the second pattern is formed between the material layer and the first pattern;
    forming a cover layer covering the first pattern, the first spacer, the second pattern, and the third pattern;
    removing a part of the cover layer for exposing the first pattern and the first spacer;
    removing the first spacer; and
    performing a third patterning process to the first pattern transfer layer with the first pattern and the cover layer as a mask after removing the first spacer, wherein the second pattern is patterned to be a fourth pattern by the third patterning process.

2. The method of fabricating the patterned structure according to claim 1, further comprising:
    performing a fourth patterning process for transferring the fourth pattern and the third pattern to the material layer.

3. The method of fabricating the patterned structure according to claim 1, wherein the second patter and the third pattern are separated from one another.

4. The method of fabricating the patterned structure according to claim 1, wherein the second pattern and the third pattern are connected with one another.

5. The method of fabricating the patterned structure according to claim 4, wherein the third pattern is patterned to be a fifth pattern by the third patterning process.

6. The method of fabricating the patterned structure according to claim 5, further comprising:
    transferring the fourth pattern and the fifth pattern to the material layer.

7. The method of fabricating the patterned structure according to claim 1, wherein the material layer is formed on a substrate, a first region and a second region are defined on the substrate, and the first pattern is formed on the first region.

8. The method of fabricating the patterned structure according to claim 7, wherein the first pattern transfer layer and the second pattern transfer layer are formed on the first region and the second region, and a part of the second pattern transfer layer is patterned to be a sixth pattern formed on the second region by the first patterning process.

9. The method of fabricating the patterned structure according to claim 8, further comprising:
    forming a second spacer on sidewalls of the sixth pattern, wherein the first spacer and the second spacer are formed concurrently.

10. The method of fabricating the patterned structure according to claim 9, further comprising:
    removing the sixth pattern; and
    performing a fifth patterning process to the first pattern transfer layer on the second region with the second spacer as a mask after removing the sixth pattern, wherein the first pattern transfer layer on the second region is patterned to be a seventh pattern by the fifth patterning process.

11. The method of fabricating the patterned structure according to claim 10, wherein the fifth patterning process is performed before the second patterning process.

12. The method of fabricating the patterned structure according to claim 10, wherein the fifth patterning process is performed after the third patterning process.

13. The method of fabricating the patterned structure according to claim 10, further comprising:

performing a sixth patterning process to the seventh pattern, wherein the seventh pattern is patterned to be an eighth pattern by the sixth patterning process.

14. The method of fabricating the patterned structure according to claim 13, wherein the sixth patterning process is performed before the second patterning process.

15. The method of fabricating the patterned structure according to claim 13, wherein the sixth patterning process is performed after the third patterning process.

16. The method of fabricating the patterned structure according to claim 13, further comprising:
performing a fourth patterning process for transferring the fourth pattern, the third pattern, and the eighth pattern to the material layer.

17. The method of fabricating the patterned structure according to claim 16, wherein the material layer on the first region is patterned to be a connection structure on a transistor by the fourth patterning process, and the material layer on the second region is patterned to be a storage node contact pad by the fourth patterning process.

18. The method of fabricating the patterned structure according to claim 1, wherein the material composition of the first pattern transfer layer is different from the material composition of the second pattern transfer layer.

* * * * *